(12) United States Patent
Jang et al.

(10) Patent No.: US 9,059,023 B2
(45) Date of Patent: Jun. 16, 2015

(54) SEMICONDUCTOR DEVICE WITH REDUCED TURN-ON RESISTANCE AND METHOD OF FABRICATING THE SAME

(71) Applicant: SAMSUNG ELECTRONICS CO., LTD., Suwon-si, Gyeonggi-do (KR)

(72) Inventors: Jae-June Jang, Hwaseong-si (KR); Hyun-Ju Kim, Hwaseong-si (KR); Seo-In Park, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/063,196

(22) Filed: Oct. 25, 2013

(65) Prior Publication Data
US 2014/0175542 A1    Jun. 26, 2014

(30) Foreign Application Priority Data
Dec. 20, 2012  (KR) .................. 10-2012-0149897

(51) Int. Cl.
*H01L 21/8238*  (2006.01)
*H01L 27/092*  (2006.01)

(52) U.S. Cl.
CPC ....... *H01L 27/092* (2013.01); *H01L 21/823807* (2013.01); *H01L 21/823814* (2013.01); *H01L 21/823842* (2013.01)

(58) Field of Classification Search
CPC .................. H01L 29/66674; H01L 29/66681; H01L 29/7816; H01L 29/7801; H01L 21/823807; H01L 21/823814; H01L 21/823842
USPC .......................................... 257/336, 407, 408
See application file for complete search history.

(56) References Cited

U.S. PATENT DOCUMENTS

| | | | |
|---|---|---|---|
| 7,405,117 B2 | 7/2008 | Zuniga et al. | |
| 7,858,466 B2 | 12/2010 | Huang et al. | |
| 7,981,739 B1 | 7/2011 | You et al. | |
| 8,063,444 B2 | 11/2011 | Chang | |
| 8,071,436 B2 | 12/2011 | You et al. | |
| 8,129,783 B2 | 3/2012 | Huang et al. | |
| 2010/0230748 A1 | 9/2010 | Hikida | |
| 2011/0241112 A1* | 10/2011 | Zuniga | 257/343 |
| 2012/0037984 A1 | 2/2012 | Yu | |
| 2013/0181286 A1* | 7/2013 | Zhang | 257/335 |

FOREIGN PATENT DOCUMENTS

KR   10-2010-0030411 A   3/2010

* cited by examiner

*Primary Examiner* — Tucker Wright
(74) *Attorney, Agent, or Firm* — Lee & Morse, P.C.

(57) ABSTRACT

A semiconductor device includes a gate pattern over source and drain regions. The gate pattern includes a first gate adjacent the source region and a second gate adjacent the drain region. A concentration of dopants in the first gate is higher than a concentration of dopants in the second gate. As a result, channels are produced between the source and drain regions based on different threshold voltages.

14 Claims, 22 Drawing Sheets

SEMICONDUCTOR DEVICE WITH REDUCED TURN-ON RESISTANCE AND METHOD OF FABRICATING THE SAME

CROSS-REFERENCE TO RELATED APPLICATION

Korean Patent Application No. 10-2012-0149897, filed on Dec. 20, 2012, and entitled "Semiconductor Device and Method of Fabricating the Same," is incorporated by reference herein in its entirety.

BACKGROUND

1. Field

One or more embodiments described herein relate to a semiconductor device.

2. Description of Related Art

Semiconductor devices perform various functions in electronic apparatuses. One type of semiconductor device is a complementary metal oxide semiconductor (CMOS) device formed from NMOS and PMOS devices. Various studies have been performed to improve operational characteristics of these and other semiconductor devices.

SUMMARY

In accordance with one embodiment, a semiconductor device includes a semiconductor substrate; a drain region in the semiconductor substrate; a body region in the semiconductor substrate and spaced from the drain region; a source region in the body region; and a gate pattern on the semiconductor substrate and including dopants of a first conductivity type, wherein the gate pattern includes a first gate adjacent the source region and a second gate adjacent the drain region, and wherein a concentration of the dopants of the first conductivity type in the first gate is higher than a concentration of the dopants of the first conductivity type in the second gate.

Also, the drain region may include the first conductivity type dopants and a concentration of the first conductivity type dopants in the drain region may be higher than a concentration of the first conductivity type dopants in the second gate.

Also, the concentration of the first conductivity type dopants in the drain region may be substantially equal to the concentration of the first conductivity type dopants in the first gate.

Also, the source region may include the first conductivity type dopants and a concentration of the first conductivity type dopants in the source region may be substantially equal to the concentration of the first conductivity type dopants in the first gate.

Also, the semiconductor device may further include a first lightly doped drain (LDD) region adjacent the source region and partially overlapping the first gate, wherein the first LDD region may include the first conductivity type dopants and a concentration of the first conductivity type dopants in the first LDD region may be lower than the concentration of the first conductivity type dopants in the first gate.

Also, the concentration of the first conductivity type dopants in the first LDD region may be substantially equal to the concentration of the first conductivity type dopants in the second gate.

Also, the semiconductor device may further include a second LDD region disposed adjacent the drain region and partially overlapping the second gate, wherein the second LDD region is spaced from the body region.

Also, the second LDD region may include the first conductivity type dopants, and a concentration of the first conductivity type dopants in the second LDD region may be substantially equal to the concentration of the first conductivity type dopants in the first LDD region.

Also, the semiconductor device may include a well disposed in the semiconductor substrate, wherein the body region and the drain region are disposed in the well.

Also, the body region and well may include second conductivity type dopants, and a concentration of the second conductivity type dopants in the well may be lower than a concentration of the second conductivity type dopants in the body region.

In accordance with another embodiment, a semiconductor device includes a semiconductor substrate; a source region in the semiconductor substrate; a drain region in the semiconductor substrate and spaced from the source region; a first gate on the semiconductor substrate and disposed between the source region and the drain region; and a second gate disposed on the semiconductor substrate, wherein the second gate is between the first gate and the drain region, and wherein a conductivity of the second gate is different from a conductivity of the first gate. The second gate may contact the first gate.

Also, a dopant concentration in the second gate may be different from a dopant concentration in the first gate. Also, the semiconductor device may include a body region adjacent the source region and vertically overlapping the first gate, wherein the body region is spaced from the drain region.

Also, the source region, the drain region, the body region, the first gate, and the second gate may have substantially a same shape extending in a first direction, and a length of the first gate in the first direction and a length of the second gate in the first direction may be larger than a distance between the body region and the source region.

In accordance with another embodiment, a semiconductor device includes a drain; a source; and a gate pattern between the source and drain, wherein: the gate pattern includes a first gate and a second gate, the first gate forms a first channel between the source and drain, and the second gate forms a second channel adjacent to the first channel between the source and drain, the first gate forming the first channel based on a first threshold voltage and the second gate forming the second channel based on a second threshold voltage different from the first threshold voltage.

Also, the first gate may have a first concentration of a dopant, the second gate may have a second concentration a dopant different from the first concentration, and the threshold voltage of the first channel may be based on the first concentration of the dopant, and the threshold voltage of the second channel may be based on the second concentration of the dopant. The first channel and the second channel may have different lengths. The first gate may contact the second gate within substantially a same layer.

Also, the semiconductor device may include a well under the source, wherein the first channel overlaps the well and the second channel does not overlap the well.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1A:
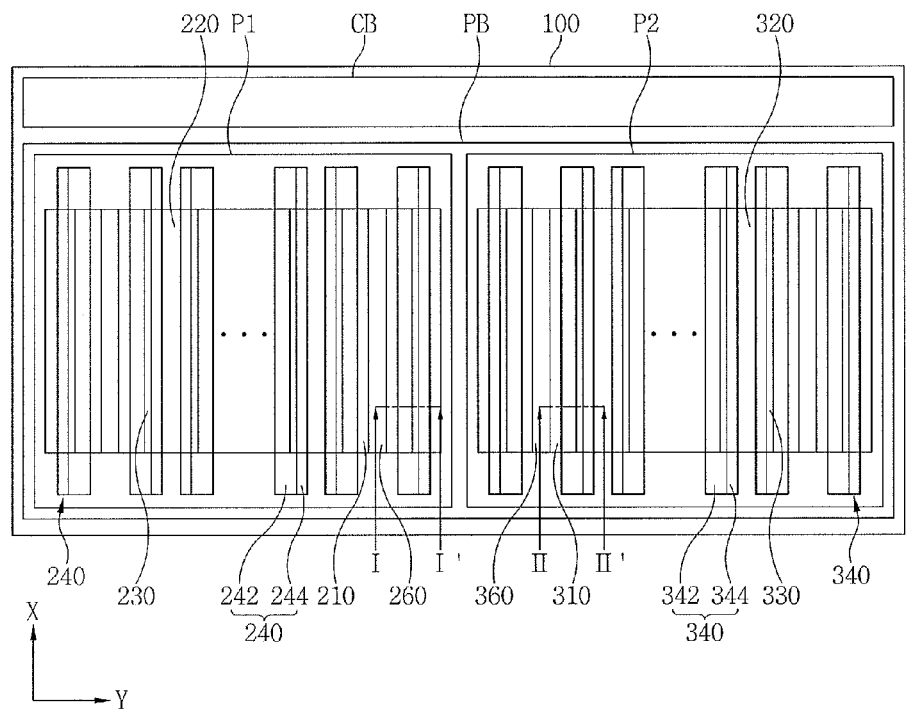
FIG. 1A illustrates an embodiment of a semiconductor device.

Example embodiments will be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1B:
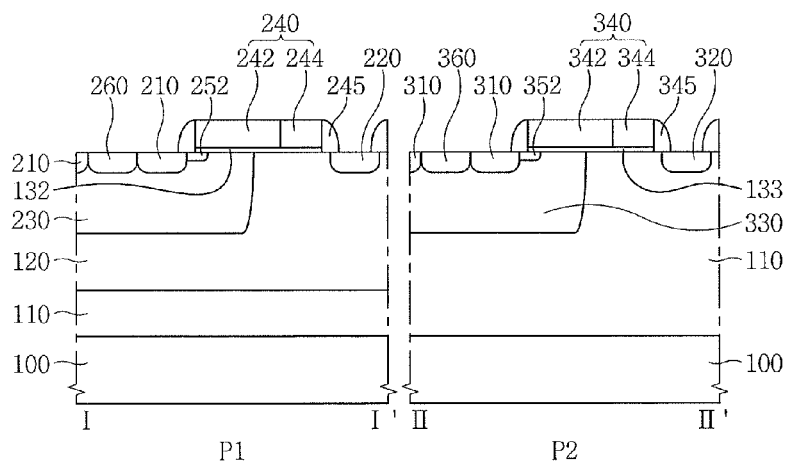
FIG. 1B illustrates cross-sectional views taken along lines I-I' and II-II' of FIG. 1A.

FIG. 1A illustrates an embodiment of a semiconductor device, and FIG. 1B illustrates a cross-sectional view taken along lines I-I' and II-II' of FIG. 1A. Referring to FIGS. 1A and 1B, a semiconductor device includes a semiconductor substrate 100, a first well 110, a second well 120, an NMOS source region 210, an NMOS drain region 220, an NMOS body region 230, an NMOS gate pattern 240, a first NMOS LDD region 252, a PMOS source region 310, a PMOS drain region 320, a PMOS body region 330, a PMOS gate pattern 340, and a first PMOS LDD region 352. The semiconductor device may be included in a power management integrated circuit (PMIC). For example, the semiconductor device according to one embodiment may include a low dropout (LDO) regulator or a buck converter of the PMIC.

The semiconductor substrate 100 may include a power block PB and a control block CB. The power block PB may include an NMOS area P1 and a PMOS area P2. A plurality of NMOS devices may be disposed in the NMOS area P1. The NMOS source region 210, the NMOS drain region 220, the NMOS body region 230, the NMOS gate pattern 240, and the first NMOS LDD region 252 may be disposed in the NMOS area P1. A plurality of PMOS devices may be disposed in the PMOS area P2. The PMOS source region 310, the PMOS drain region 320, the PMOS body region 330, the PMOS gate pattern 340, and the first PMOS LDD region 352 may be disposed in the PMOS area P2. The control block CB may control the NMOS gate pattern 240 and the PMOS gate pattern 340.

The semiconductor device may include a plurality of NMOS devices according to one embodiment. That is, a plurality of NMOS source regions 210, a plurality of NMOS drain regions 220, a plurality of NMOS body regions 230, a plurality of NMOS gate patterns 240, and a plurality of first NMOS LDD regions 252 may be disposed in the NMOS area P1. In other embodiments, one NMOS device may be disposed in the NMOS area P1. That is, one NMOS source region 210, one NMOS drain region 220, one NMOS body region 230, one NMOS gate pattern 240, and one first NMOS LDD region 252 may be disposed in the NMOS area P1.

Further, the semiconductor device may include a plurality of PMOS devices according to one embodiment. That is, a plurality of PMOS source regions 310, a plurality of PMOS drain regions 320, a plurality of PMOS body regions 330, a plurality of PMOS gate patterns 340, and a plurality of first PMOS LDD regions 352 may be disposed in the PMOS area P2. In other embodiments, one PMOS device may be disposed in the PMOS area P2. That is, one PMOS source region 310, one PMOS drain region 320, one PMOS body region 330, one PMOS gate pattern 340, and one first PMOS LDD region 352 may be disposed in the PMOS area P2.

The semiconductor substrate 100 may be a silicon semiconductor substrate with dopants of a predetermined conductivity type. For example, the semiconductor substrate may include P-type dopants.

The first well 110 may be disposed in the semiconductor substrate 100. The first well 110 may be disposed at a predetermined location, e.g., close to a top of the semiconductor substrate 100. As shown in FIG. 1B, the first well 110 may be disposed in the NMOS area P1 and the PMOS area P2 of the semiconductor substrate 100.

The first well 110 may include dopants having a conductivity type different from that of the semiconductor substrate 100. For example, the first well 110 may include N-type dopants. In one embodiment, an average concentration of the N-type dopants in the first well 110 may be higher than that of the P-type dopants in the semiconductor substrate 100. For example, the average concentration of the N-type dopants in the first well 110 may be in a range of $5 \times 10^{14}$ to $1 \times 10^{16}$ atoms/cm$^2$. The average concentration may be understood to mean a concentration per unit area of a corresponding region.

The second well 120 may be disposed in the semiconductor structure 100. In one embodiment, the second well 120 may be disposed only in the NMOS area P1 of the semiconductor substrate 100. The NMOS area P1 may be defined by the second well 120. The second well 120 may be disposed in the first well 110 of the NMOS area P1. The second well 120 may be at a predetermined location, e.g., disposed close to a top of the first well 110 of the NMOS area P1. The lowest level of the second well 120 may be higher than that of the first well 110.

The second well 120 may include dopants having a conductivity type different from that of the first well 110. In one embodiment, the second well 120 has dopants with the same conductivity type as those of the semiconductor substrate 100. For example, the second well 120 may include P-type dopants.

Also, in one embodiment, an average concentration of the P-type dopants in the second well 120 may be higher than that of the P-type dopants in the semiconductor substrate 100. The average concentration of the P-type dopants in the second well 120 may be higher than that of the N-type dopants in the first well 110. For example, the average concentration of the P-type dopants in the second well 120 may be in a range of $5\times10^{15}$ to $1\times10^{17}$ atoms/cm$^2$.

The NMOS source region 210 may be disposed in the second well 120. The NMOS source region 210 may be disposed close to a top of the second well 120. The NMOS source region 210 may extend in a first (X) direction in the second well 120. For example, the NMOS source region 210 may have a bar shape extending along the top of the second well 120. The lowest level of the NMOS source region 210 may be higher than that of the second well 120.

The NMOS source region 210 may include dopants having a conductivity type different from that of the second well 120. The NMOS source region 210 may include dopants with the same conductivity type as those of the first well 110. For example, the NMOS source region 210 may include N-type dopants. In one embodiment, an average concentration of the N-type dopants in the NMOS source region 210 may be higher than that of the N-type dopants in the first well 110. For example, the average concentration of the N-type dopants in the NMOS source region 210 may be in a range of $3\times10^{19}$ to $5\times10^{20}$ atoms/cm$^2$.

The NMOS drain region 220 may be disposed in the second well 120. The NMOS drain region 220 may be at a predetermined location, e.g., disposed close to the top of the second well 120. The NMOS drain region 220 may extend in the first (X) direction in the second well 120. The NMOS drain region 220 may be spaced apart from the NMOS source region 210. In one embodiment, the NMOS drain region 220 may be parallel to the NMOS source region 210.

A shape of the NMOS drain region 220 may be the same as that of the NMOS source region 210. For example, the NMOS drain region 220 may have a bar shape extending along the top of the second well 120. Also, a length of the NMOS drain region 220 in the first (X) direction may be the same as that of the NMOS source region 210 in the first (X) direction. The lowest level of the NMOS drain region 220 may be higher than that of the second well 120. The lowest level of the NMOS drain region 220 may be the same as that of the NMOS source region 210.

The NMOS drain region 220 may include dopants having a conductivity type different from that of the second well 120. The NMOS drain region 220 may include the same conductivity type dopants as those of the first well 110. The NMOS drain region 220 may include the same conductivity type dopants as those of the NMOS source region 210. For example, the NMOS drain region 220 may include N-type dopants. In one embodiment, an average concentration of the N-type dopants in the NMOS drain region 220 may be higher than that of the N-type dopants in the first well 110. Also, the average concentration of the N-type dopants in the NMOS drain region 220 may be the same, or in a same range, as that of the N-type dopants in the NMOS source region 210. For example, the average concentration of the N-type dopants in the NMOS drain region 220 may be in a range of $3\times10^{19}$ to $5\times10^{20}$ atoms/cm$^2$.

A channel may be formed in the NMOS body region 230 by the NMOS gate pattern 240. The NMOS body region 230 may be disposed in the second well 120. The NMOS body region 230 may be disposed, for example, at the top of the second well 120. Also, the NMOS body region 230 may extend in the first (X) direction. A length of the NMOS body region 230 in the first (X) direction may be the same as that of the NMOS source region 210 in the first (X) direction. The lowest level of the NMOS body region 230 may be higher than that of the second well 120. The NMOS body region 230 may surround a side and a bottom of the NMOS source region 210.

In one embodiment, a length of the NMOS body region 230 in the second (Y) direction may be larger than that of the NMOS source region 210 in the second (Y) direction. The second (Y) direction may be a direction perpendicular to the first (X) direction. The lowest level of the NMOS body region 230 may be lower than that of the NMOS source region 210. The NMOS source region 210 may be disposed in the NMOS body region 230. The NMOS body region 230 may be spaced apart from the NMOS drain region 220. The NMOS body region 230 may be parallel to the NMOS drain region 220. A length of the NMOS body region 230 in the first (X) direction may be larger than that of the NMOS body region 230 in the second (Y) direction. For example, the NMOS body region 230 may have a bar shape extending to the first (X) direction.

The NMOS body region 230 may include dopants having a conductivity type different from that of the NMOS source region 210. The NMOS body region 230 may include the same conductivity type dopants as those of the second well 120. For example, the NMOS body region 230 may include P-type dopants. In one embodiment, an average concentration of the P-type dopants in the NMOS body region 230 may be higher than that of the P-type dopants in the second well 120. The average concentration of the P-type dopants in the NMOS body region 230 may be lower than that of the N-type dopants in the NMOS source region 210. For example, the average concentration of the P-type dopants in the NMOS body region 230 may be in a range of $1\times10^{16}$ to $3\times10^{18}$ atoms/cm$^3$.

In accordance with one embodiment, the semiconductor device may have a first channel formed in the NMOS body region 230 and a second channel formed in the second well 120 between the NMOS drain region 220 and the NMOS body region 230. The first channel and the second channel may connect between the NMOS source region 210 and the NMOS drain region 220. For example, the first channel and the second channel may extend in the first (X) direction. The average concentration of the P-type dopants in the second well 120 may be lower than that of the P-type dopants in the NMOS body region 230. Therefore, in the semiconductor device according to one embodiment, a threshold voltage of the second channel may be lower than that of the first channel. Therefore, in such a semiconductor device, turn-on resistance between the NMOS source region 210 and the NMOS drain region 220 may be reduced.

The NMOS gate pattern 240 may be disposed on the semiconductor substrate 100. The NMOS gate pattern 240 may extend in the first (X) direction. A length of the NMOS gate pattern 240 in the first (X) direction may be larger than that of the second (Y) direction of the NMOS gate pattern 240. For example, the NMOS gate pattern 240 may have a bar shape extending to the first (X) direction. The NMOS gate pattern 240 may be disposed between the NMOS source region 210 and the NMOS drain region 220. The NMOS gate pattern 240 may partially vertically overlap the NMOS body region 230.

The length of the NMOS gate pattern 240 in the second (Y) direction may be the same as a length between the NMOS source region 210 and the NMOS drain region 220 in the second (Y) direction. The length of the NMOS gate pattern 240 in the second (Y) direction may be equal to a sum of a length of the first channel in the second (Y) direction and a length of the second channel in the second (Y) direction. The length of the NMOS gate pattern 240 in the first (X) direction may be substantially larger than a length of a channel formed between the NMOS source region 210 and the NMOS drain region 220.

The NMOS gate pattern 240 may be electrically connected to the control block CB. The length of the NMOS gate pattern 240 in the first (X) direction may be larger than that of the NMOS source region 210 in the first (X) direction and that of the NMOS drain region 220 in the first (X) direction. The length of the NMOS gate pattern 240 in the first (X) direction may be larger than that of the NMOS body region 230 in the first (X) direction. For example, the NMOS gate pattern 240 may include polysilicon.

The NMOS gate pattern 240 may form the first channel and the second channel. The NMOS gate pattern 240 may include a first NMOS gate 242 and a second NMOS gate 244. The first NMOS gate 242 and the second NMOS gate 244 may interrupt carrier movement between the NMOS source region 210 and the NMOS drain region 220.

The first NMOS gate 242 may be disposed at a predetermined location, e.g., close to the NMOS source region 210. The first NMOS gate 242 may partially vertically overlap the NMOS body region 230. The first NMOS gate 242 may include dopants having a conductivity type different from that of the NMOS body region 230. The first NMOS gate 242 may include the same conductivity type dopants as those of the NMOS source region 210. For example, the first NMOS gate 242 may include N-type dopants. In one embodiment, an average concentration of the N-type dopants in the first NMOS gate 242 may be the same, or in a same range, as that of the N-type dopants in the NMOS source region 210. For example, the average concentration of the N-type dopants in the first NMOS gate 242 may be in a range of $3 \times 10^{19}$ to $5 \times 10^{20}$ atoms/cm$^3$.

The second NMOS gate 244 may be disposed close to the NMOS drain region 220. The second NMOS gate 244 may not vertically overlap the NMOS body region 230. The second NMOS gate 244 may be disposed between the NMOS drain region 220 and the NMOS body region 230. A horizontal distance (shown as the width in Table 1) of the second NMOS gate 244 may be smaller than a horizontal distance between the NMOS drain region 220 and the NMOS body region 230 on the top of the semiconductor substrate 100. An interface between the first NMOS gate 242 and the second NMOS gate 244 may be disposed between the NMOS drain region 220 and the NMOS body region 230. An extension line of a side of the NMOS body region 230 may pass through the first NMOS gate 242. The first NMOS gate 242 may partially vertically overlap the second well 120 between the NMOS drain region 220 and the NMOS body region 230.

The second NMOS gate 244 may have different conductivity from the first NMOS gate 242. The second NMOS gate 244 may not include N-type dopants and P-type dopants. The second NMOS gate 244 may be an intrinsic region. For example, the conductivity of the second NMOS gate 244 may be lower than that of the first NMOS gate 242.

In one embodiment, the second NMOS gate 244, which is an intrinsic region, may be disposed close to the NMOS drain region 220. Therefore, parasitic capacitance between the NMOS drain region 220 and the NMOS gate pattern 240 may be reduced.

Further, in one embodiment, the first NMOS gate 242 may be disposed on the NMOS body region 230 disposed between the NMOS source region 210 and the NMOS drain region 220. Also, the first NMOS gate 242 and the second NMOS gate 244 may be disposed on the second well 120 disposed between the NMOS source region 210 and the NMOS drain region 220. That is, in one embodiment, the first channel may be formed by the first NMOS gate 242 and the second channel may be formed by the first NMOS gate 242 and the second NMOS gate 244. Because the threshold voltage of the second channel is lower than that of the first channel, the second channel may not function as a substantial channel. Therefore, in one embodiment, a horizontal distance of the substantial channel between the NMOS source region 210 and the NMOS drain region 220 may be smaller than that between the NMOS source region 210 and the NMOS drain region 220.

Also, in one embodiment, even when the horizontal distance of a region which may function as a substantial channel between the NMOS source region 210 and the NMOS drain region 220 becomes short, the parasitic capacitance between the NMOS drain region 220 and the NMOS gate pattern 240 may be reduced. Therefore, a breakdown voltage between the NMOS source region 210 and the NMOS drain region 220 may be increased and turn-on resistance between the NMOS source region 210 and the NMOS drain region 220 may be reduced.

A horizontal distance of the second NMOS gate 244 may be smaller than that of the first NMOS gate 242. The horizontal distance of the first NMOS gate 242 and the horizontal distance of the second NMOS gate 244 may be controlled according to a voltage applied to the NMOS drain region 220. For example, the horizontal distance of the first NMOS gate 242 and the horizontal distance of the second NMOS gate 244 may be controlled according to the voltage applied to the NMOS drain region 220 as illustrated in Table 1.

TABLE 1

| Voltage applied to NMOS Drain | 6 V | 8 V | 10 V | 12 V |
|---|---|---|---|---|
| Width of First NMOS Gate | 0.3 μm | 0.4 μm | 0.45 μm | 0.5 μm |
| Width of Second NMOS Gate | 0.2 μm | 0.3 μm | 0.4 μm | 0.5 μm |

In one embodiment, the first NMOS gate 242 may be in contact with the second NMOS gate 244. However, in other embodiments, the first NMOS gate 242 may be spaced apart from the second NMOS gate 244. For example, the NMOS gate pattern 240 may further include a third NMOS gate disposed between the first NMOS gate 242 and the second NMOS gate 244.

The third NMOS gate may include the same conductivity type dopants as those of the first NMOS gate 242. For example, the third NMOS gate may include N-type dopants. In one embodiment, an average concentration of the N-type dopants in the third NMOS gate may be different from that of the N-type dopants in the first NMOS gate 242. The average concentration of the N-type dopants in the third NMOS gate may be lower than that of the N-type dopants in the first NMOS gate 242.

The first NMOS LDD region 252 may be disposed in the second well 120. The first NMOS LDD region 252 may be disposed in the NMOS body region 230. The first NMOS LDD region 252 may be disposed at a predetermined location, e.g., close to the top of the NMOS body region 230. The first NMOS LDD region 252 may be disposed close to the NMOS source region 210. The first NMOS LDD region 252 may be disposed between the NMOS source region 210 and the NMOS drain region 220. The lowest level of the first NMOS LDD region 252 may be higher than that of the NMOS source region 210. The first NMOS LDD region 252 may partially vertically overlap the first NMOS gate 242.

The first NMOS LDD region 252 may include dopants having a conductivity type different from that of the NMOS body region 230. The first NMOS LDD region 252 may include the same conductivity type dopants as those of the NMOS source region 210. For example, the first NMOS LDD region 252 may include N-type dopants. In one embodiment, an average concentration of the N-type dopants in the first NMOS LDD region 252 may be lower than that of the N-type dopants in the NMOS source region 210. For example, the average concentration of the N-type dopants in the first NMOS LDD region 252 may be in a range of $1\times10^{18}$ to $1\times10^{19}$ atoms/cm$^2$.

Also, in one embodiment, a reference voltage is supplied to the NMOS body region 230 and the second well 120 to reduce leakage current. To this end, the semiconductor device may further include an NMOS body contact region 260.

The NMOS body contact region 260 may be disposed in the NMOS body region 230. The NMOS body contact region 260 may be disposed at a predetermined location, e.g., close to the top of the NMOS body region 230. The NMOS body contact region 260 may also be disposed at a predetermined location, e.g., close to the NMOS source region 210. The lowest level of the NMOS body contact region 260 may be the same as that of the NMOS source region 210. The NMOS body contact region 260 may be disposed in an outer side of the NMOS gate pattern 240. The NMOS body contact region 260 may not vertically overlap the NMOS gate pattern 240. The NMOS source region 210 may be disposed between the NMOS body contact region 260 and the first NMOS LDD region 252.

The NMOS body contact region 260 may include the same conductivity type dopants as those of the NMOS body region 230. The NMOS body contact region 260 may include dopants having a conductivity type different from that of the NMOS source region 210. For example, the NMOS body contact region 260 may include P-type dopants. In one embodiment, an average concentration of the P-type dopants in the NMOS body contact region 260 may be higher than that of the P-type dopants in the NMOS body region 230. Also, the average concentration of the P-type dopants in the NMOS body contact region 260 may be the same as that of the N-type dopants in the NMOS source region 210. For example, the average concentration of the P-type dopants in the NMOS body contact region 260 may be in a range of $3\times10^{19}$ to $5\times10^{20}$ atoms/cm$^2$.

In one embodiment, the semiconductor device may further include an NMOS oxide pattern 132 and one or more NMOS spacers 245. The NMOS oxide pattern 132 may be disposed between the semiconductor substrate 100 and the NMOS gate pattern 240. Each NMOS spacer 245 may be disposed on a respective side of the NMOS gate pattern 240.

A side of the NMOS oxide pattern 132 may be vertically aligned with the side of the NMOS gate pattern 240. Each NMOS spacer 245 may extend, for example, onto the top of the semiconductor substrate 100 along a respective side of the NMOS gate pattern 240. Each NMOS spacer 245 may cover a side of the NMOS oxide pattern 132. Also, each NMOS spacer 245 may be in direct contact with a respective side of the NMOS gate pattern 240 and a side of the NMOS oxide pattern 132. A bottom of each NMOS spacer 245 may be in direct contact with the top of the semiconductor substrate 100.

The PMOS source region 310 may be disposed in the PMOS area P2 of the semiconductor substrate 100. The PMOS source region 310 may be disposed in the first well 110 of the PMOS area P2. The PMOS source region 310 may be disposed at a predetermined location, e.g., close to the top of the first well 110. The PMOS source region 310 may extend in the first (X) direction. For example, the PMOS source region 310 may have a bar shape extending along the top of the first well 110.

The PMOS source region 310 may be parallel to the NMOS source region 210. A length of the PMOS source region 310 in the first (X) direction may be the same as that of the NMOS source region 210 in the first (X) direction. The lowest level of the PMOS source region 310 may be higher than that of the first well 110. The lowest level of the PMOS source region 310 may be the same as that of the NMOS source region 210.

The PMOS source region 310 may include dopants having a conductivity type different from that of the first well 110. The PMOS source region 310 may include the same conductivity type dopants as those of the second well 120. For example, the PMOS source region 310 may include P-type dopants. In one embodiment, an average concentration of the P-type dopants in the PMOS source region 310 may be higher than that of the P-type dopants in the second well 120. Also, the average concentration of the P-type dopants in the PMOS source region 310 may be the same, or in the same range, as that of the N-type dopants in the NMOS source region 210. For example, the average concentration of the P-type dopants in the PMOS source region 310 may be in a range of $3\times10^{19}$ to $5\times10^{20}$ atoms/cm$^2$.

The PMOS drain region 320 may be disposed in the first well 110 of the PMOS area P2. The PMOS drain region 320 may be disposed at a predetermined location, e.g., close to the top of the first well 110. The PMOS drain region 320 may extend in the first (X) direction. The PMOS drain region 320 may be spaced apart from the PMOS source region 310. The PMOS drain region 320 may be parallel to the PMOS source region 310. A shape of the PMOS drain region 320 may be the same as that of the PMOS source region 310. For example, the PMOS drain region 320 may have a bar shape. In one embodiment, a length of the PMOS drain region 320 in the first (X) direction may be the same as that of the PMOS source region 310 in the first (X) direction. The lowest level of the PMOS drain region 320 may be the same as that of the PMOS source region 310.

The PMOS drain region 320 may include the same conductivity type dopants as those of the second well 120. The PMOS drain region 320 may include the same conductivity type dopants as those of the PMOS source region 310. The PMOS drain region 320 may include P-type dopants. In one embodiment, an average concentration of the P-type dopants in the PMOS drain region 320 may be higher than that of the P-type dopants in the second well 120. Also, the average concentration of the P-type dopants in the PMOS drain region 320 may be the same, or in the same range, as that of the P-type dopants in the PMOS source region 310. For example, the average concentration of the P-type dopants in the PMOS drain region 320 may be in a range of $3\times10^{19}$ to $5\times10^{20}$ atoms/cm$^2$.

A channel may be formed in the PMOS body region 330 by the PMOS gate pattern 340. The PMOS body region 330 may be disposed in the first well 110 of the PMOS area P2. The PMOS body region 330 may be disposed at a predetermined location, e.g., in the top of the first well 110. The PMOS body region 310 may extend in the first (X) direction. A length of the PMOS body region 330 in the first (X) direction may be the same as that of the PMOS source region 310 in the first (X) direction.

The lowest level of the PMOS body region 330 may be higher than that of the first well 110. The lowest level of the PMOS body region 330 may be the same as that of the NMOS body region 230. The PMOS body region 330 may surround a side and a bottom of the PMOS source region 310. A length of the PMOS body region 330 in a second (Y) direction may be larger than that of the PMOS source region 310 in the second (Y) direction.

The PMOS source region 310 may be disposed in the PMOS body region 330. The PMOS body region 330 may be spaced apart from the PMOS drain region 320. The PMOS body region 330 may be parallel to the PMOS drain region

320. A length of the PMOS body region 330 in the first (X) direction may be larger than that of the PMOS body region 330 in the second (Y) direction. For example, the PMOS body region 330 may have a bar shape extending to the first (X) direction.

The PMOS body region 330 may include dopants having a conductivity type different from that of the PMOS source region 310. The PMOS body region 330 may include the same conductivity type dopants as those of the first well 110. For example, the PMOS body region 330 may include N-type dopants. In one embodiment, an average concentration of the N-type dopants in the PMOS body region 330 may be higher than that of the N-type dopants in the first well 110. Also, the average concentration of the N-type dopants in the PMOS body region 330 may be lower than that of the P-type dopants in the PMOS source region 310. For example, the average concentration of the N-type dopants in the PMOS body region 330 may be in a range of $1 \times 10^{16}$ to $3 \times 10^{18}$ atoms/cm$^3$.

In one embodiment, the semiconductor device may include a third channel formed in the PMOS body region 330 and a fourth channel formed in the first well 110 between the PMOS drain region 320 and the PMOS body region 330. The third channel and the fourth channel may connect between the PMOS source region 310 and the PMOS drain region 320. For example, the third channel and the fourth channel may extend in the first (X) direction. Also, the average concentration of the N-type dopants in the first well 110 may be lower than that of the N-type dopants in the PMOS body region 330. Therefore, a threshold voltage of the fourth channel may be lower than that of the third channel. Accordingly, according to one embodiment, turn-on resistance between the PMOS source region 310 and the PMOS drain region 320 may be reduced.

The PMOS gate pattern 340 may be disposed on the semiconductor substrate 100. The PMOS gate pattern 340 may extend to the first (X) direction. A length of the PMOS gate pattern 340 in the first (X) direction may be larger than that of the PMOS gate pattern 340 in the second (Y) direction. For example, the PMOS gate pattern 340 may have a bar shape extending to the first (X) direction. The PMOS gate pattern 340 may be disposed between the PMOS source region 310 and the PMOS drain region 320.

The PMOS gate pattern 340 may partially vertically overlap the PMOS body region 330. The length of the PMOS gate pattern 340 in the second (Y) direction may be the same as a length between the PMOS source region 310 and the PMOS drain region 320 in the second (Y) direction. The length of the PMOS gate pattern 340 in the second (Y) direction may be equal to a sum of a length of the third channel in the second (Y) direction and a length of the fourth channel in the second (Y) direction. The length of the PMOS gate pattern 340 in the first (X) direction may be much larger than a length of a channel formed between the PMOS source region 310 and the PMOS drain region 320.

The PMOS gate pattern 340 may be electrically connected to the control block CB. The length of the PMOS gate pattern 340 in the first (X) direction may be larger than that of the PMOS source region 310 in the first (X) direction and that of the PMOS drain region 320 in the first (X) direction. The length of the PMOS gate pattern 340 in the first (X) direction may be substantially larger than that of the PMOS body region 330 in the first (X) direction.

The PMOS gate pattern 340 may include the same material as the NMOS gate pattern 240. For example, the PMOS gate pattern 340 may include polysilicon. The PMOS gate pattern 340 may form the third channel and the fourth channel. The PMOS gate pattern 340 may include a first PMOS gate 342 and a second PMOS gate 344. The first PMOS gate 342 and the second PMOS gate 344 may interrupt carrier movement between the PMOS source region 310 and the PMOS drain region 320.

The first PMOS gate 342 may be disposed at a predetermined location, e.g., close to the PMOS source region 310. The first PMOS gate 342 may partially vertically overlap the PMOS body region 330. The first PMOS gate 342 may include dopants having a conductivity type different from that of the PMOS body region 330. The first PMOS gate 342 may include the same conductivity type dopants as those of the PMOS source region 310. For example, the first PMOS gate 342 may include P-type dopants. In one embodiment, an average concentration of the P-type dopants in the first PMOS gate 342 may be the same, or in a same range, as that of the P-type dopants in the PMOS source region 310. For example, the average concentration of the P-type dopants in the first PMOS gate 342 may be in a range of $3 \times 10^{19}$ to $5 \times 10^{20}$ atoms/cm$^3$.

The second PMOS gate 344 may be disposed close to the PMOS drain region 320. The second PMOS gate 344 may not vertically overlap the PMOS body region 330. The second PMOS gate 344 may be disposed between the PMOS drain region 320 and the PMOS body region 330. A horizontal distance of the second PMOS gate 344 may be smaller than a horizontal distance between the PMOS drain region 320 and the PMOS body region 330 on the top of the semiconductor substrate 100.

An interface between the first PMOS gate 342 and the second PMOS gate 344 may be disposed between the PMOS drain region 320 and the PMOS body region 330. An extension line of a side of the PMOS body region 330 may pass through the first PMOS gate 342. The first PMOS gate 342 may partially vertically overlap the first well 110 between the PMOS drain region 320 and the PMOS body region 330.

The second PMOS gate 344 may have different conductivity from the first PMOS gate 342. The second PMOS gate 344 may not include N-type dopants and P-type dopants. The second PMOS gate 344 may be an intrinsic region. For example, the conductivity of the second PMOS gate 344 may be lower than that of the first PMOS gate 342.

In one embodiment, the second PMOS gate 344, which is an intrinsic region, may be disposed close to the PMOS drain region 320. Therefore, parasitic capacitance between the PMOS drain region 320 and the PMOS gate pattern 340 may be reduced. Further, the third channel may be formed by the first PMOS gate 342 and the fourth channel may be formed by the first PMOS gate 342 and the second PMOS gate 344. Therefore, a horizontal distance of the substantial channel may be shortened. Also, in one embodiment, a breakdown voltage between the PMOS source region 310 and the PMOS drain region 320 may be increased and turn-on resistance between the PMOS source region 310 and the PMOS drain region 320 may be reduced.

A horizontal distance of the second PMOS gate 344 may be smaller than that of the first PMOS gate 342. The horizontal distance of the first PMOS gate 342 and the horizontal distance of the second PMOS gate 344 may be controlled according to a voltage applied to the PMOS drain region 320. For example, the horizontal distance of the first PMOS gate 342 and the horizontal distance of the second PMOS gate 344 may be controlled according to the voltage applied to the PMOS drain region 320 as illustrated in Table 2.

TABLE 2

| Voltage applied to PMOS Drain | 6 V | 8 V | 10 V | 12 V |
|---|---|---|---|---|
| Width of First PMOS Gate | 0.3 μm | 0.4 μm | 0.45 μm | 0.5 μm |
| Width of Second PMOS Gate | 0.2 μm | 0.3 μm | 0.4 μm | 0.5 μm |

In one embodiment, the first PMOS gate 342 may be in contact with the second PMOS gate 344. In other embodiments, the first PMOS gate 342 may be spaced apart from the second PMOS gate 344. For example, the PMOS gate pattern 340 may further include a third PMOS gate disposed between the first PMOS gate 342 and the second PMOS gate 344.

The third PMOS gate may include the same conductivity type dopants as those of the first PMOS gate 342. For example, the third PMOS gate may include P-type dopants. In one embodiment, an average concentration of the P-type dopants in the third PMOS gate may be different from that of the P-type dopants in the first PMOS gate 342. For example, the average concentration of the P-type dopants in the third PMOS gate may be lower than that of the P-type dopants in the first PMOS gate 342.

The first PMOS LDD region 352 may be disposed in the first well 110 of the PMOS area P2. The first PMOS LDD region 352 may be disposed in the PMOS body region 330. The first PMOS LDD region 352 may be disposed at a predetermined location, e.g., close to a top of the PMOS body region 330. The first PMOS LDD region 352 may be disposed close to the PMOS source region 310. The first PMOS LDD region 352 may be disposed between the PMOS source region 310 and the PMOS drain region 320. The lowest level of the first PMOS LDD region 352 may be higher than that of the PMOS source region 310. The first PMOS LDD region 352 may partially vertically overlap the first PMOS gate 342.

The first PMOS LDD region 352 may include dopants having a conductivity type different from that of the PMOS body region 330. The first PMOS LDD region 352 may include the same conductivity type dopants as those of the PMOS source region 310. For example, the first PMOS LDD region 352 may include P-type dopants. In one embodiment, an average concentration of the P-type dopants in the first PMOS LDD region 352 may be lower than that of the P-type dopants in the PMOS source region 310. For example, the average concentration of the P-type dopants in the first PMOS LDD region 352 may be in a range of $1 \times 10^{18}$ to $1 \times 10^{19}$ atoms/cm$^2$.

In one embodiment, the semiconductor device may include a PMOS body contact region 360. A reference voltage may be supplied to the PMOS body region 330 and the first well 110 to reduce leakage current.

The PMOS body contact region 360 may be disposed in the PMOS body region 330. The PMOS body contact region 360 may be disposed at a predetermined location, e.g., close to the top of the PMOS body region 330. The PMOS body contact region 360 may be disposed close to the PMOS source region 310. The lowest level of the PMOS body contact region 360 may be the same as that of the PMOS source region 310. The PMOS body contact region 360 may be disposed in an outer side of the PMOS gate pattern 340. The PMOS body contact region 360 may not vertically overlap the PMOS gate pattern 340. The PMOS source region 310 may be disposed between the PMOS body contact region 360 and the PMOS drain region 320. The PMOS source region 310 may be disposed between the PMOS body contact region 360 and the first PMOS LDD region 352.

The PMOS body contact region 360 may include the same conductivity type dopants as those of the PMOS body region 330. The PMOS body contact region 360 may include dopants having a conductivity type different from that of the PMOS source region 310. For example, the PMOS body contact region 360 may include N-type dopants. In one embodiment, an average concentration of the N-type dopants in the PMOS body contact region 360 may be higher than that of the N-type dopants in the PMOS body region 330. Also, the average concentration of the N-type dopants in the PMOS body contact region 360 may be the same, or in a same range, as that of the P-type dopants in the PMOS source region 310. For example, the average concentration of the N-type dopants in the PMOS body contact region 360 may be in a range of $3 \times 10^{19}$ to $5 \times 10^{20}$ atoms/cm$^2$.

In one embodiment, the semiconductor device may include a PMOS oxide pattern 133 and one or more PMOS spacers 345. The PMOS oxide pattern 133 may be disposed between the semiconductor substrate 100 and the PMOS gate pattern 340. Each PMOS spacer 345 may be disposed on a respective side of the PMOS gate pattern 340.

A side of the PMOS oxide pattern 133 may be vertically aligned with the side of the PMOS gate pattern 340. Each PMOS spacer 345 may extend onto the top of the semiconductor substrate 100 along the side of the PMOS gate pattern 340. Also, each PMOS spacer 345 may cover a side of the PMOS oxide pattern 133. Also, each PMOS spacer 345 may be in direct contact with a respective side of the PMOS gate pattern 340 and the side of the PMOS oxide pattern 133. A bottom of each PMOS spacer 345 may be in direct contact with the top of the semiconductor substrate 100.

Figure 2:
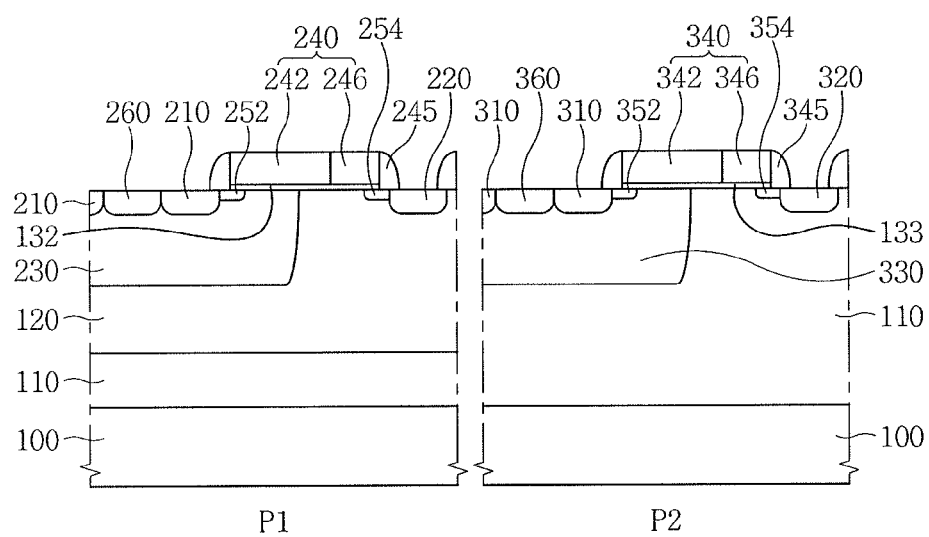
FIG. 2 illustrates another embodiment of a semiconductor device.

FIG. 2 illustrates another embodiment of a semiconductor device which includes a semiconductor substrate 100, a first well 110, a second well 120, an NMOS source region 210, an NMOS drain region 220, an NMOS body region 230, an NMOS gate pattern 240, a first NMOS LDD region 252, a second NMOS LDD region 254, a PMOS source region 310, a PMOS drain region 320, a PMOS body region 330, a PMOS gate pattern 340, a first PMOS LDD region 352, and a second PMOS LDD region 354.

The semiconductor substrate 100 may include an NMOS area P1 and a PMOS area P2. Also, in one embodiment, the semiconductor device includes an NMOS oxide pattern 132, a PMOS oxide pattern 133, one or more NMOS spacers 245, an NMOS body contact region 260, one or more PMOS spacers 345, and a PMOS body contact region 360.

The NMOS gate pattern 240 may include a first NMOS gate 242 and a second NMOS gate 246. The second NMOS gate 246 may include the same conductivity type dopants as those of the first NMOS gate 242. For example, the second NMOS gate 246 may include N-type dopants. In one embodiment, an average concentration of the N-type dopants in the second NMOS gate 246 may be lower than that of the N-type dopants in the first NMOS gate 242. Also, the average concentration of the N-type dopants in the second NMOS gate 246 may be lower than that of the N-type dopants in the NMOS drain region 220. The average concentration of the N-type dopants in the second NMOS gate 246 may be the same, or a same range, as that of the N-type dopants in the first NMOS LDD region 252. For example, the average concentration of the N-type dopants in the second NMOS gate 246 may be in a range of $1 \times 10^{18}$ to $1 \times 10^{19}$ atoms/cm$^3$.

The second NMOS LDD region 254 may be disposed in the second well 120. The second NMOS LDD region 254 may be disposed at a predetermined location, e.g., close to a top of the second well 120. The second NMOS LDD region 254 may be disposed in the second well 120 between the NMOS drain region 220 and the NMOS body region 230. The second NMOS LDD region 254 may be disposed close to the NMOS drain region 220. The second NMOS LDD region 254 may be spaced apart from the NMOS body region 230. The lowest level of the second NMOS LDD region 254 may be higher than that of the NMOS drain region 220. The lowest level of the second NMOS LDD region 254 may be the same as that of the first NMOS LDD region 252. The second NMOS LDD region 254 may partially vertically overlap the second NMOS gate 246.

The second NMOS LDD region 254 may include dopants having a conductivity type different from that of the second well 120. The second NMOS LDD region 254 may include the same conductivity type dopants as those of the NMOS drain region 220. For example, the second NMOS LDD region 254 may include N-type dopants. In one embodiment, an average concentration of the N-type dopants in the second NMOS LDD region 254 may be lower than that of the N-type dopants in the NMOS drain region 220. The average concentration of the N-type dopants in the second NMOS LDD region 254 may be the same, or in a same range, as that of the N-type dopants in the first NMOS LDD region 252. For example, the average concentration of the N-type dopants in the second NMOS LDD region 254 may be in a range of $1 \times 10^{18}$ to $1 \times 10^{19}$ atoms/cm$^2$. The average concentration of the N-type dopants in the second NMOS LDD region 254 may be the same, or in a same range, as that of the N-type dopants in the second NMOS gate 246.

The PMOS gate pattern 340 may include a first PMOS gate 342 and a second PMOS gate 346. The second PMOS gate 346 may include the same conductivity type dopants as those of the first PMOS gate 342. For example, the second PMOS gate 346 may include P-type dopants. In one embodiment, an average concentration of the P-type dopants in the second PMOS gate 346 may be lower than that of the P-type dopants in the first PMOS gate 342. The average concentration of the P-type dopants in the second PMOS gate 346 may be lower than that of the P-type dopants in the PMOS drain region 320. The average concentration of the P-type dopants in the second PMOS gate 346 may be the same, or in a same range, as that of the P-type dopants in the first PMOS LDD region 352. For example, the average concentration of the P-type dopants in the second PMOS gate 346 may be in a range of $1 \times 10^{18}$ to $1 \times 10^{19}$ atoms/cm$^3$.

The second PMOS LDD region 354 may be disposed in the first well 110. The second PMOS LDD region 354 may be disposed close to the top of the first well 110. The second PMOS LDD region 354 may be disposed in the first well 110 between the PMOS drain region 320 and the PMOS body region 330. The second PMOS LDD region 354 may be disposed close to the PMOS drain region 320. The second PMOS LDD region 354 may be spaced apart from the PMOS body region 330. The lowest level of the second PMOS LDD region 354 may be higher than that of the PMOS drain region 320. The lowest level of the second PMOS LDD region 354 may be the same as that of the first PMOS LDD region 352. The second PMOS LDD region 354 may partially vertically overlap the second PMOS gate 346.

The second PMOS LDD region 354 may include dopants having a conductivity type different from that of the first well 110. The second PMOS LDD region 354 may include the same conductivity type dopants as those of the PMOS drain region 320. For example, the second PMOS LDD region 354 may include P-type dopants. In one embodiment, an average concentration of the P-type dopants in the second PMOS LDD region 354 may be lower than that of the P-type dopants in the PMOS drain region 320. The average concentration of the P-type dopants in the second PMOS LDD region 354 may be the same, or in a same range, as that of the P-type dopants in the first PMOS LDD region 352. For example, the average concentration of the P-type dopants in the second PMOS LDD region 354 may be in a range of $1 \times 10^{18}$ to $1 \times 10^{19}$ atoms/cm$^2$. The average concentration of the P-type dopants in the second PMOS LDD region 354 may be the same, or in a same range, as that of the P-type dopants in the second PMOS gate 346.

Figure 3:
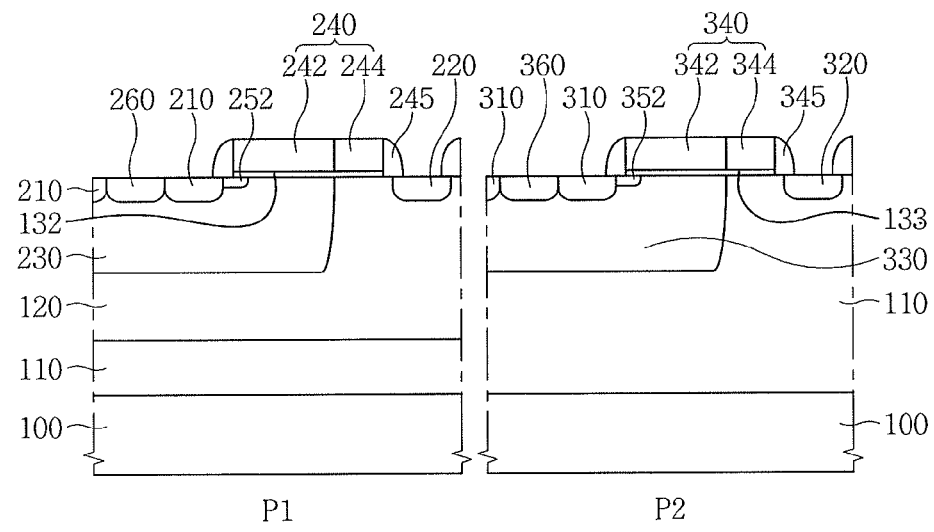
FIG. 3 illustrates another embodiment of a semiconductor device.

FIG. 3 illustrates another embodiment of a semiconductor device which includes a semiconductor substrate 100 including an NMOS area P1 and a PMOS area P2, a first well 110 disposed in the semiconductor substrate 100, a second well 120 disposed in the first well 110 of the NMOS area P1, an NMOS oxide pattern 132 disposed on the second well 120, a PMOS oxide pattern 133 disposed on the first well 110 of the PMOS area P2, an NMOS drain region 220 disposed in the second well 120, an NMOS body region 230 disposed in the second well 120, an NMOS source region 210 disposed in the NMOS body region 230, an NMOS gate pattern 240 disposed on the NMOS oxide pattern 132, one or more NMOS spacers 245 disposed on respective side(s) of the NMOS gate pattern 240, a first NMOS LDD region 252 disposed close to the NMOS source region 210, and a NMOS body contact region 260 disposed in the NMOS body region 230.

The semiconductor device also includes a PMOS drain region 320 disposed in the first well 110 of the PMOS area P2, a PMOS body region 330 disposed in the first well 110 of the PMOS area P2 and spaced apart from the PMOS drain region 320, a PMOS source region 310 disposed in the PMOS body region 330, a PMOS gate pattern 340 disposed on the PMOS oxide pattern 133, one or more PMOS spacers 345 disposed on respective side(s) of the PMOS gate pattern 340, a first PMOS LDD region 352 disposed close to the PMOS source region 310, and a PMOS body contact region 360 disposed in the PMOS body region 330.

The NMOS gate pattern 240 may include a first NMOS gate 242 and a second NMOS gate 244. An interface between the first NMOS gate 242 and the second NMOS gate 244 may be identical with an extension line of a side of the NMOS body region 230.

In this embodiment, a first channel may be formed in the NMOS body region 230 by the first NMOS gate 242, and a second channel may be formed in the second well 120 by the second NMOS gate 244. A threshold voltage of the second channel may be lower than that of the first channel. Therefore, a breakdown voltage between the NMOS source region 210 and the NMOS drain region 220 may be increased and turn-on resistance between the NMOS source region 210 and the NMOS drain region 220 may be reduced.

The PMOS gate pattern 340 may include a first PMOS gate 342 and a second PMOS gate 344. An interface between the first PMOS gate 342 and the second PMOS gate 344 may be identical with an extension line of a side of the PMOS body region 330.

Also, in this embodiment, a third channel may be formed in the PMOS body region 330 by the first PMOS gate 342, and a fourth channel may be formed in the first well 110 by the second PMOS gate 344. A threshold voltage of the fourth channel may be lower than that of the third channel. Therefore, a breakdown voltage between the PMOS source region 310 and the PMOS drain region 320 may be increased and turn-on resistance between the PMOS source region 310 and the PMOS drain region 320 may be reduced.

Figure 4:
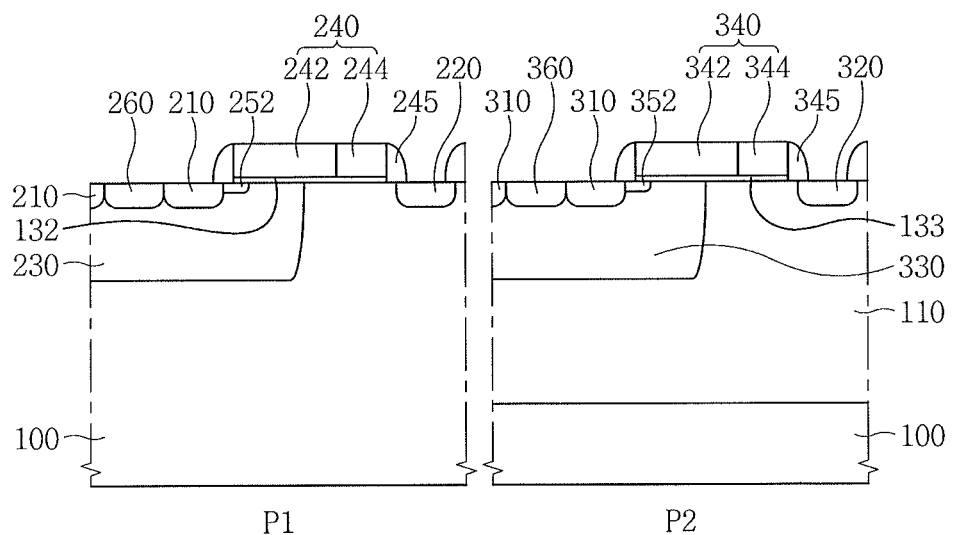
FIG. 4 illustrates another embodiment of a semiconductor device.

FIG. 4 illustrates another embodiment of a semiconductor device which includes a semiconductor substrate 100, a first well 110, an NMOS oxide pattern 132, a PMOS oxide pattern 133, an NMOS source region 210, an NMOS drain region 220, an NMOS body region 230, an NMOS gate pattern 240, one or more NMOS spacers 245, a first NMOS LDD region 252, and an NMOS body contact region 260.

The semiconductor device may also include a PMOS source region 310, a PMOS drain region 320, a PMOS body region 330, a PMOS gate pattern 340, one or more PMOS spacers 345, a first PMOS LDD region 352, and a PMOS body contact region 360. The semiconductor substrate 100 may include an NMOS area P1 and a PMOS area P2. The NMOS gate pattern 240 may include a first NMOS gate 242 and a second NMOS gate 244. The PMOS gate pattern 340 may include a first PMOS gate 342 and a second PMOS gate 344.

The first well 110 may be disposed only in the PMOS area P2 of the semiconductor substrate 100. The PMOS source region 310, the PMOS drain region 320, the PMOS body region 330, the first PMOS LDD region 352, and the PMOS body contact region 360 may be disposed in the first well 110. The PMOS source region 310, the PMOS drain region 320, the PMOS body region 330, the first PMOS LDD region 352, and the PMOS body contact region 360 may be disposed close to a top of the first well 110. The PMOS gate pattern 340 may be disposed on the first well 110.

The NMOS source region 210, the NMOS drain region 220, the NMOS body region 230, the first NMOS LDD region 252, and the NMOS body contact region 260 may be disposed in the NMOS area P1 of the semiconductor substrate 100. The NMOS source region 210, the NMOS drain region 220, the NMOS body region 230, the first NMOS LDD region 252, and the NMOS body contact region 260 may be disposed close to a top of the NMOS area P1 of the semiconductor substrate 100. The NMOS gate pattern 240 may not vertically overlap the first well 110. The NMOS source region 210, the NMOS drain region 220, the NMOS body region 230, the NMOS gate pattern 240, the first NMOS LDD region 252, and the NMOS body contact region 260 may be disposed to be spaced apart from the first well 110.

In this embodiment, a first channel may be formed in the NMOS body region 230 by the NMOS gate pattern 240, and a fifth channel may be formed in the semiconductor substrate 100 between the NMOS drain region 220 and the NMOS body region 230 by the NMOS gate pattern 240. An average concentration of the P-type dopants in the semiconductor substrate 100 may be lower than that of the P-type dopants in the NMOS body region 230. A threshold voltage of the fifth channel may be lower than that of the first channel. Therefore, a breakdown voltage between the NMOS source region 210 and the NMOS drain region 220 may be increased and turn-on resistance between the NMOS source region 210 and the NMOS drain region 220 may be reduced.

Figure 5:
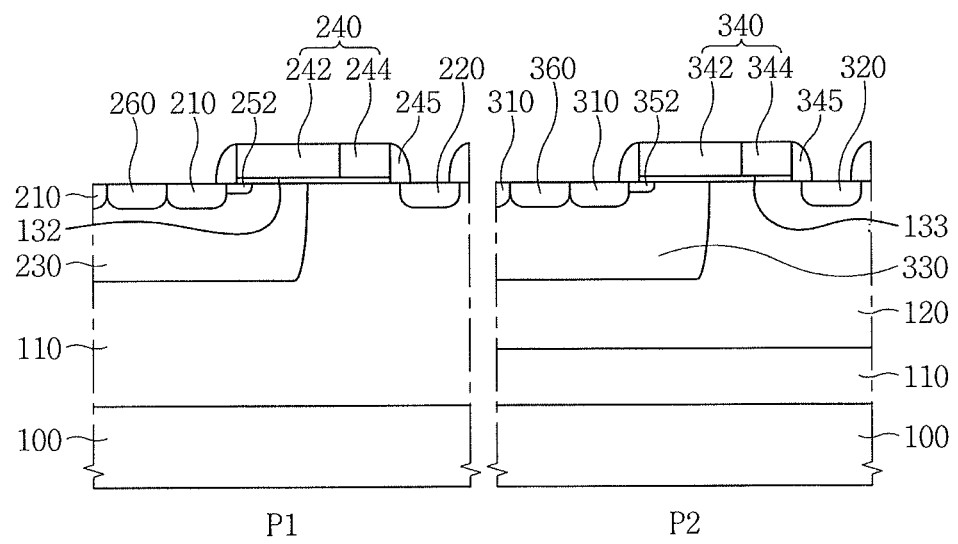
FIG. 5 illustrates another embodiment of a semiconductor device.

FIG. 5 illustrates another embodiment of a semiconductor device which includes a semiconductor substrate 100 including an NMOS area P1 and a PMOS area P2, a first well 110, a second well 120, an NMOS oxide pattern 132, a PMOS oxide pattern 133, an NMOS source region 210, an NMOS drain region 220, an NMOS body region 230, an NMOS gate pattern 240 including a first NMOS gate 242 and a second NMOS gate 244, one or more NMOS spacers 245, a first NMOS LDD region 252, and an NMOS body contact region 260. The semiconductor device may also include a PMOS source region 310, a PMOS drain region 320, a PMOS body region 330, a PMOS gate pattern 340 including a first PMOS gate 342 and a second PMOS gate 344, one or more PMOS spacers 345, a first PMOS LDD region 352, and a PMOS body contact region 360.

The second well 120 may be disposed only in the PMOS area P2 of the semiconductor substrate 100. The PMOS source region 310, the PMOS drain region 320, the PMOS body region 330, the first PMOS LDD region 352, and the PMOS body contact region 360 may be disposed in the second well 120. The PMOS source region 310, the PMOS drain region 320, the PMOS body region 330, the first PMOS LDD region 352, and the PMOS body contact region 360 may be disposed close to a top of the second well 120. The PMOS gate pattern 340 may be disposed on the second well 120.

The NMOS source region 210, the NMOS drain region 220, the NMOS body region 230, the first NMOS LDD region 252, and the NMOS body contact region 260 may be disposed in the first well 110 of the NMOS area P1 in the semiconductor substrate 100. The NMOS source region 210, the NMOS drain region 220, the NMOS body region 230, the first NMOS LDD region 252, and the NMOS body contact region 260 may be disposed close to a top of the first well 110. The NMOS gate pattern 240 may be disposed on the first well 110. The NMOS gate pattern 240 may not vertically overlap the second well 120.

In this embodiment, the first well 110 including N-type dopants may be disposed between the NMOS drain region 220 and the NMOS body region 230. Also, the second well 120 including P-type dopants may be disposed between the PMOS drain region 320 and the PMOS body region 330. Thus, even when the horizontal distance of a region which may function as a substantial channel between the source region and the drain region becomes short, the parasitic capacitance between the drain region and the gate pattern may be reduced. Therefore, a breakdown voltage between the source region and the drain region is increased and turn-on resistance between the source region and the drain region may be reduced.

Figure 6:
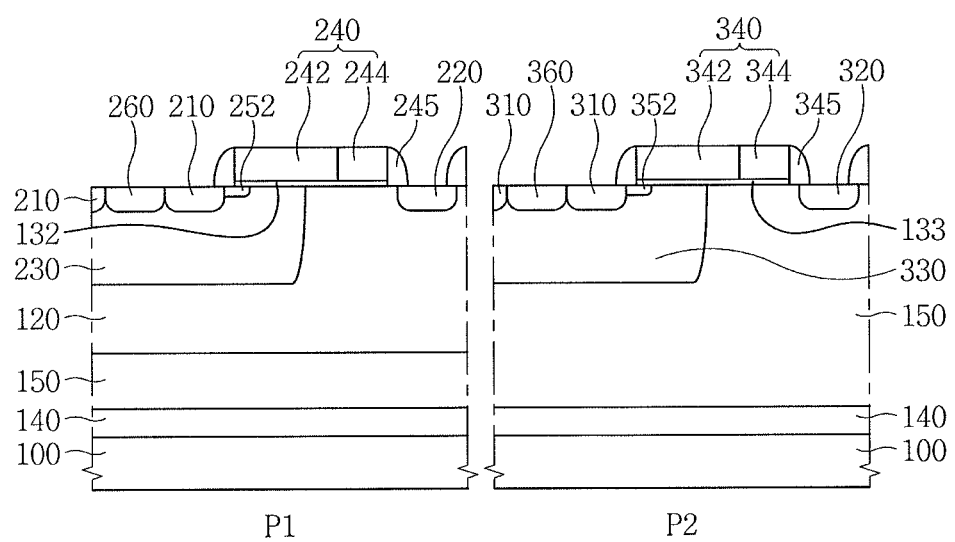
FIG. 6 illustrates another embodiment of a semiconductor device.

FIG. 6 illustrates another embodiment of a semiconductor device which includes a semiconductor substrate 100 including an NMOS area P1 and a PMOS area P2, a buried layer 140, an epitaxial layer 150, a second well 120, an NMOS oxide pattern 132, a PMOS oxide pattern 133, an NMOS source region 210, an NMOS drain region 220, an NMOS body region 230, an NMOS gate pattern 240 including a first NMOS gate 242 and a second NMOS gate 244, one or more NMOS spacers 245, a first NMOS LDD region 252, and an NMOS body contact region 260. The semiconductor device further includes a PMOS source region 310, a PMOS drain region 320, a PMOS body region 330, a PMOS gate pattern 340 including a first PMOS gate 242 and a second PMOS gate 244, one or more PMOS spacers 345, a first PMOS LDD region 352, and a PMOS body contact region 360.

The buried layer 140 may be disposed in the semiconductor substrate 100. The buried layer 140 may be disposed in the NMOS area P1 and the PMOS area P2 of the semiconductor substrate 100. The buried layer 140 may include dopants having a conductivity type different from that of the semiconductor substrate 100. For example, the buried layer 140 may include N-type dopants. In one embodiment, an average concentration of the N-type dopants in the buried layer 140 may be higher than that of the P-type dopants in the semiconductor substrate 100. For example, the average concentration of the N-type dopants in the buried layer 140 may be in a range of $1\times10^{16}$ to $5\times10^{17}$ atoms/cm$^2$.

The epitaxial layer 150 may be disposed on the buried layer 140. The epitaxial layer 150 may be disposed in the NMOS area P1 and the PMOS area P2 of the semiconductor substrate 100. The epitaxial layer 150 may include dopants having a conductivity type different from that of the semiconductor substrate 100. The epitaxial layer 150 may include the same conductivity type dopants as those of the buried layer 140. For example, the epitaxial layer 150 may include N-type dopants.

In this embodiment, an average concentration of the N-type dopants in the epitaxial layer 150 may be lower than that of the N-type dopants in the buried layer 140. An average concentration of the N-type dopants in the epitaxial layer 150 may be higher than that of the P-type dopants in the semiconductor substrate 100. For example, the average concentration of the N-type dopants in the epitaxial layer 150 may be in a range of $5 \times 10^{14}$ to $1 \times 10^{16}$ atoms/cm$^2$.

The second well 120 may be disposed in the epitaxial layer 150 of the NMOS area P1. The lowest level of the second well 120 may be higher than that of the epitaxial layer 150. An average concentration of the P-type dopants in the second well 120 may be higher than that of the N-type dopants in the epitaxial layer 150.

The PMOS source region 310, the PMOS drain region 320, the PMOS body region 330, the first PMOS LDD region 352, and the PMOS body contact region 360 may be disposed in the epitaxial layer 150 of the PMOS area P2. The PMOS source region 310, the PMOS drain region 320, the PMOS body region 330, the first PMOS LDD region 352, and the PMOS body contact region 360 may be disposed close to a top of the epitaxial layer 150. The PMOS gate pattern 340 may not vertically overlap the second well 120.

In this embodiment, a third channel may be formed in the PMOS body region 330 by the first PMOS gate 342, and a sixth channel may be formed in the epitaxial layer 150 by the second PMOS gate 344. A threshold voltage of the sixth channel may be lower than that of the third channel. Therefore, a breakdown voltage between the PMOS source region 310 and the PMOS drain region 320 may be increased and turn-on resistance between the PMOS source region 310 and the PMOS drain region 320 may be reduced.

Figure 7A:
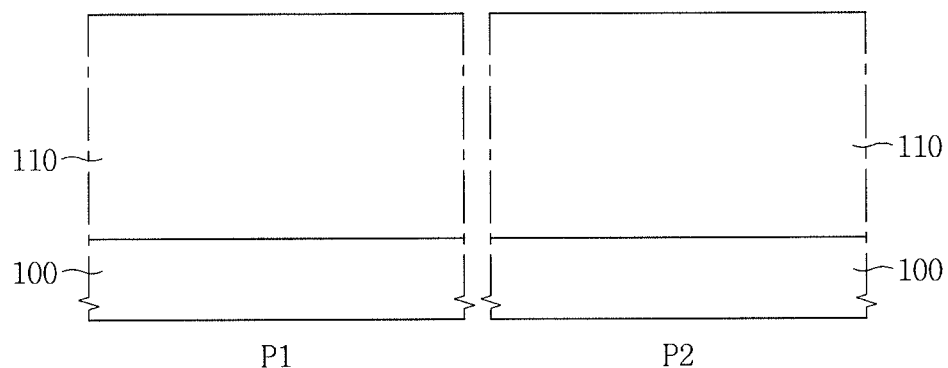
FIGS. 7A to 7X illustrate an embodiment of a method of fabricating a semiconductor device.
Figure 7B:
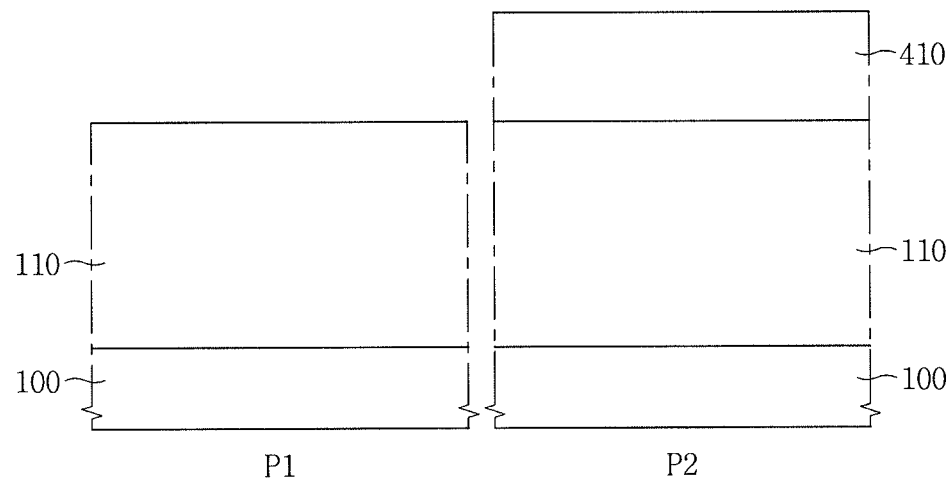
Figure 7C:
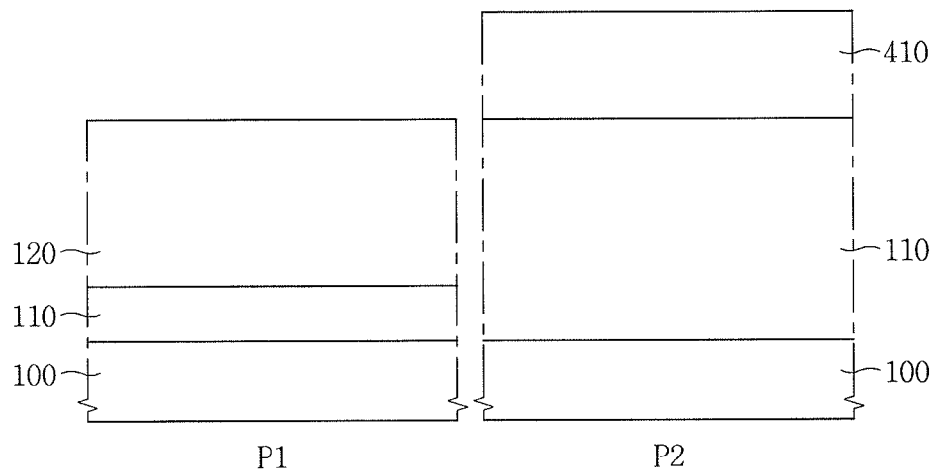
Figure 7D:
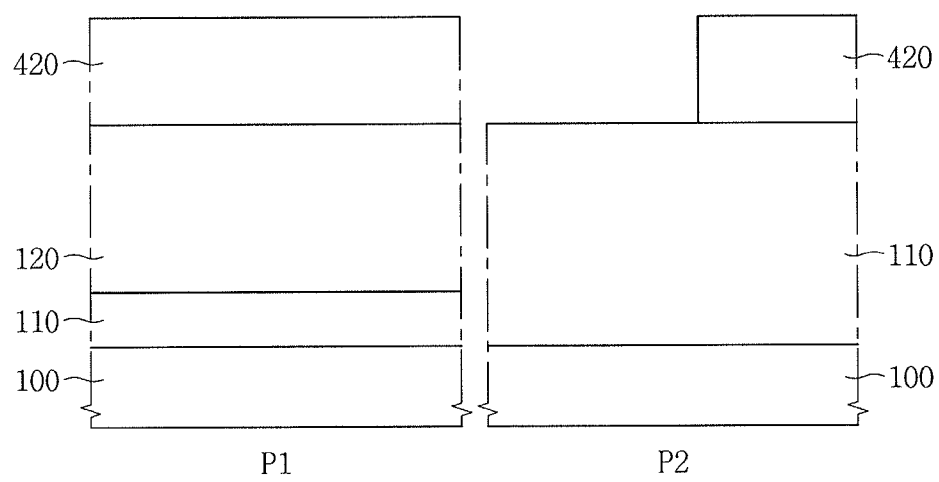
Figure 7E:
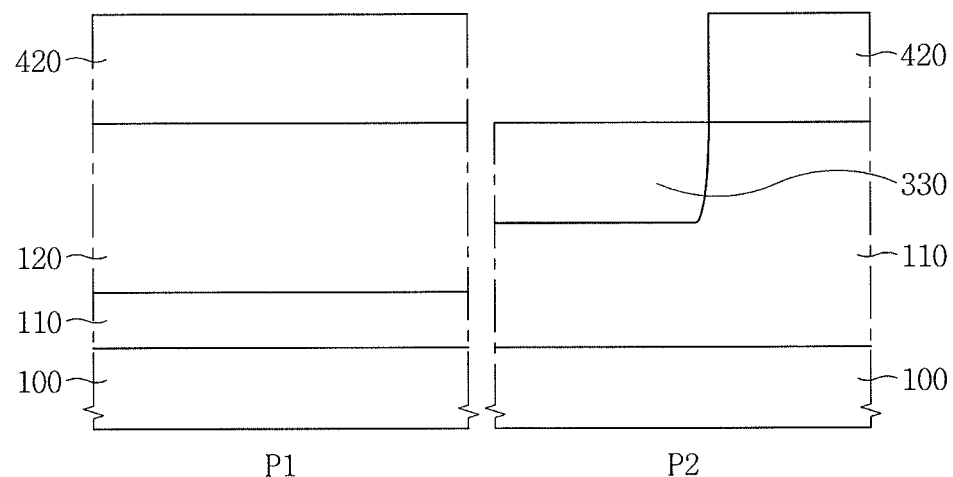
Figure 7F:
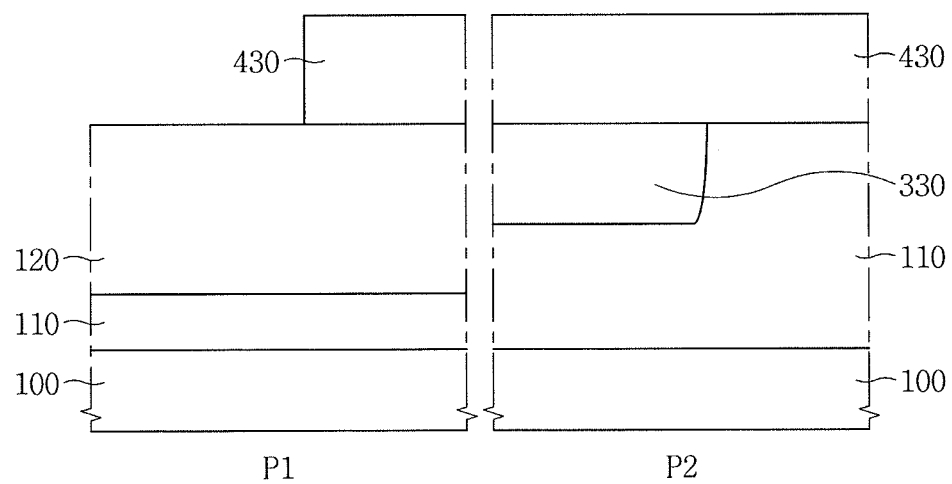
Figure 7G:
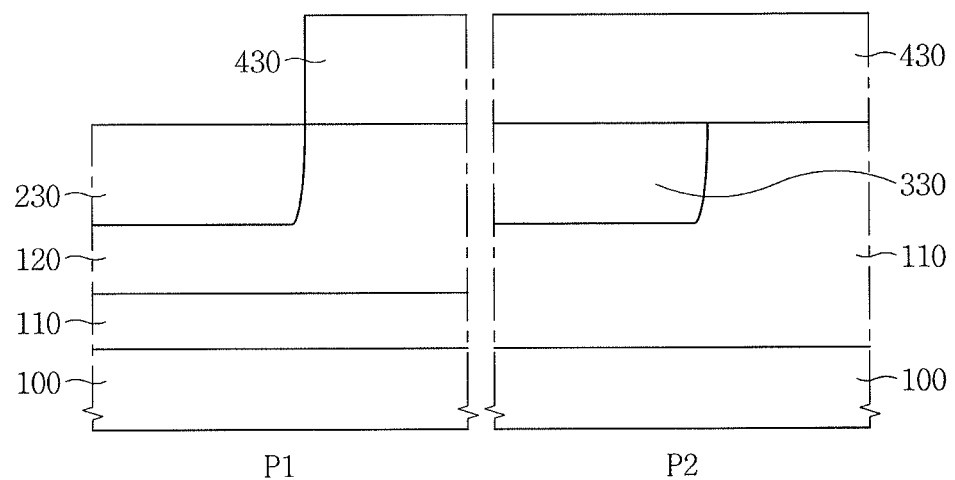
Figure 7H:
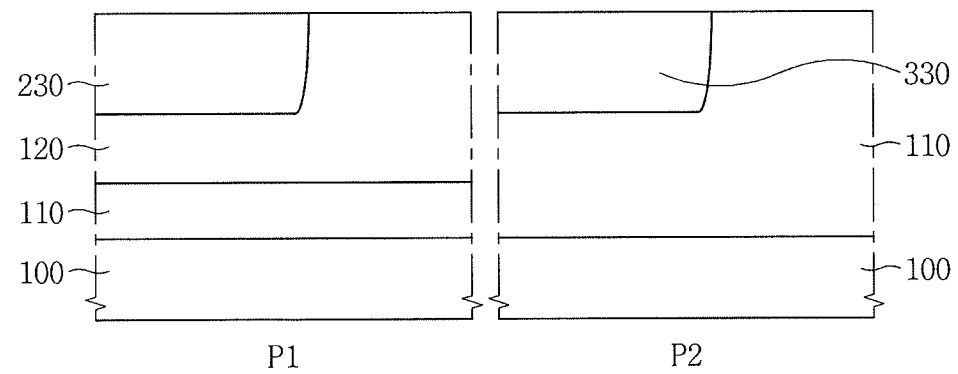
Figure 7I:
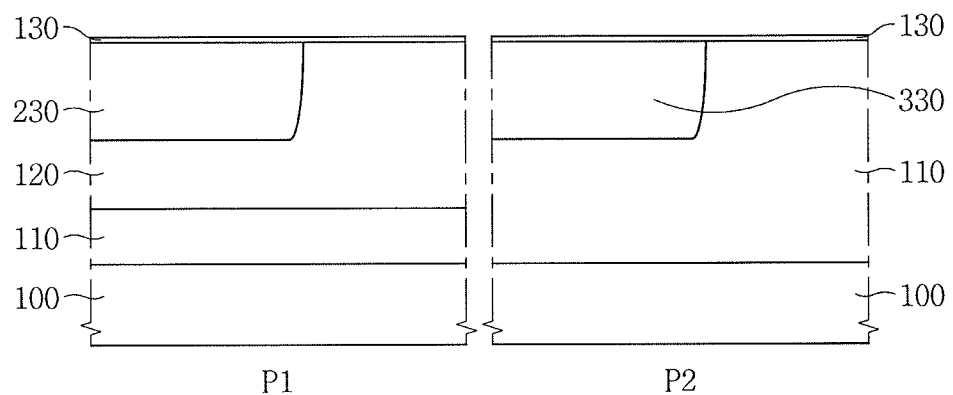
Figure 7J:
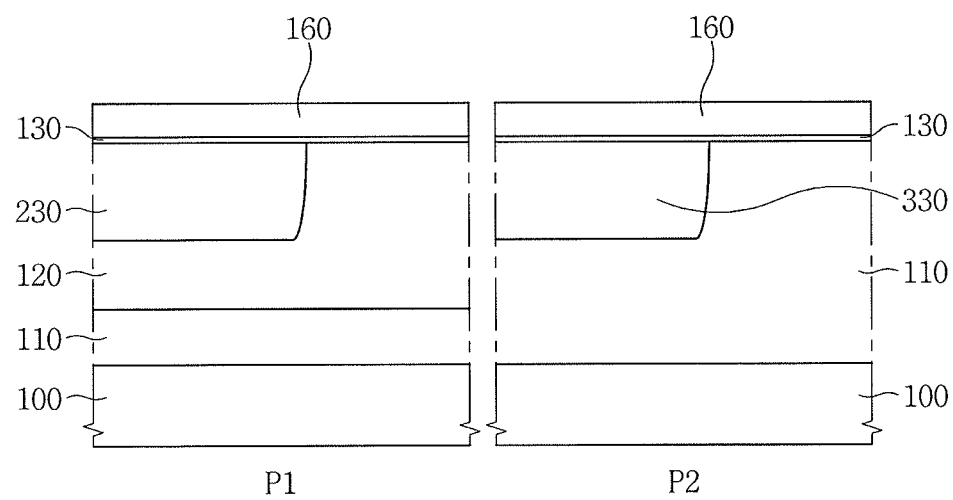
Figure 7K:
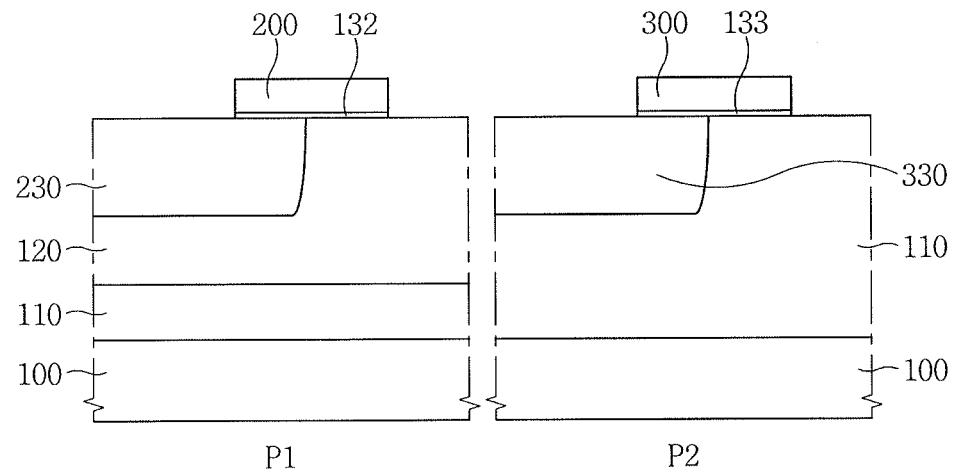
Figure 7L:
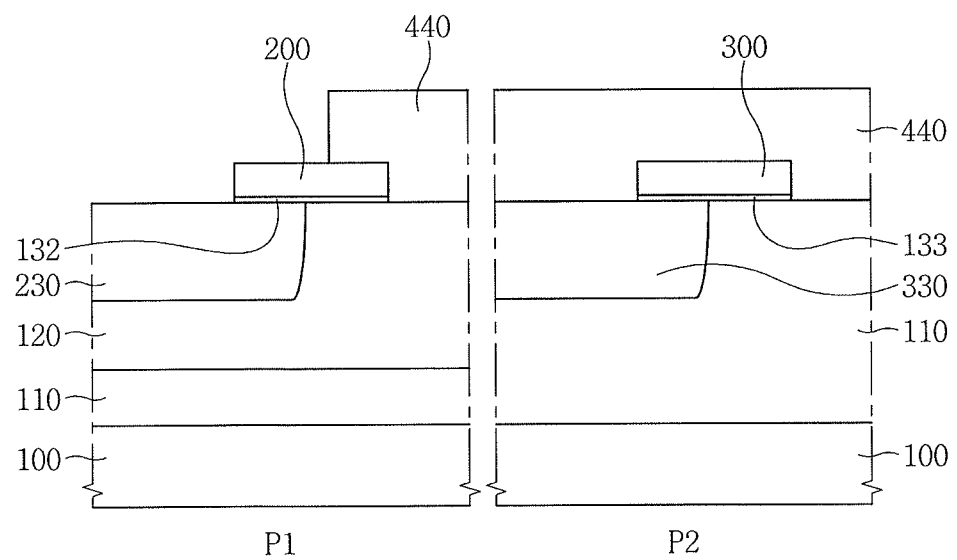
Figure 7M:
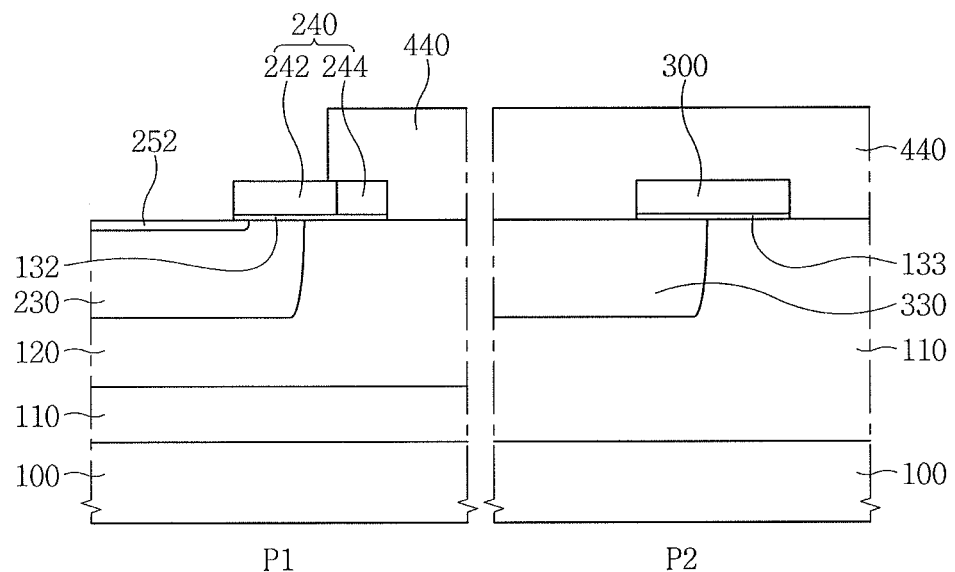
Figure 7N:
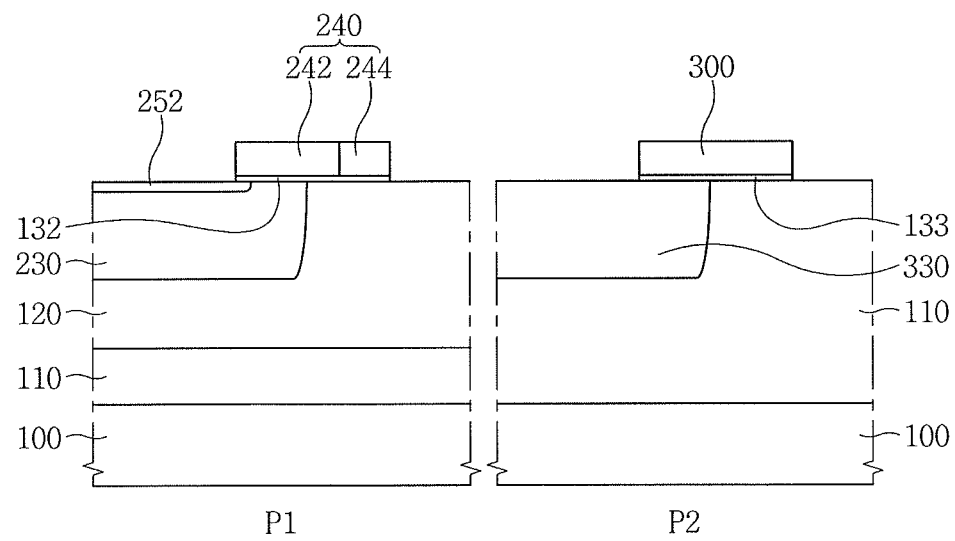
Figure 7O:
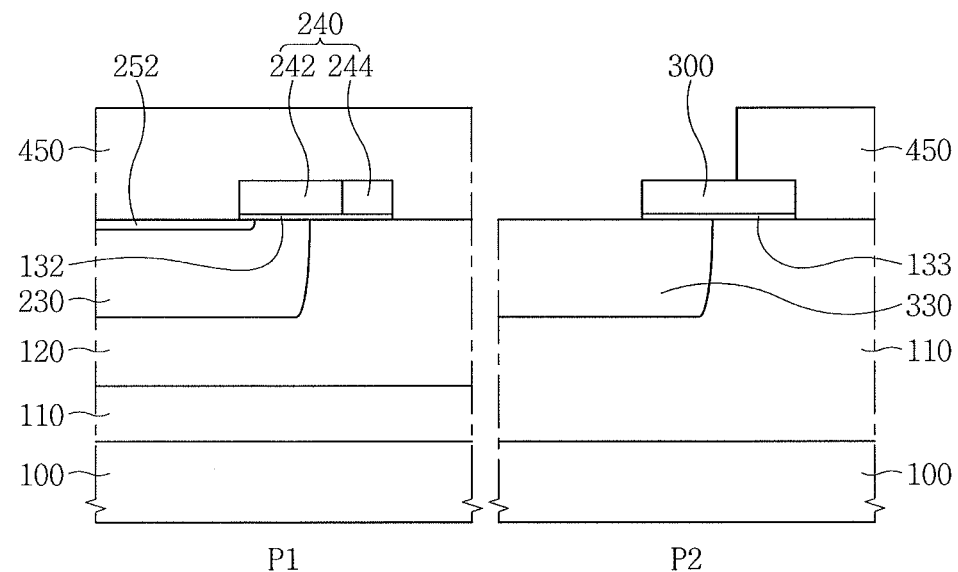
Figure 7P:
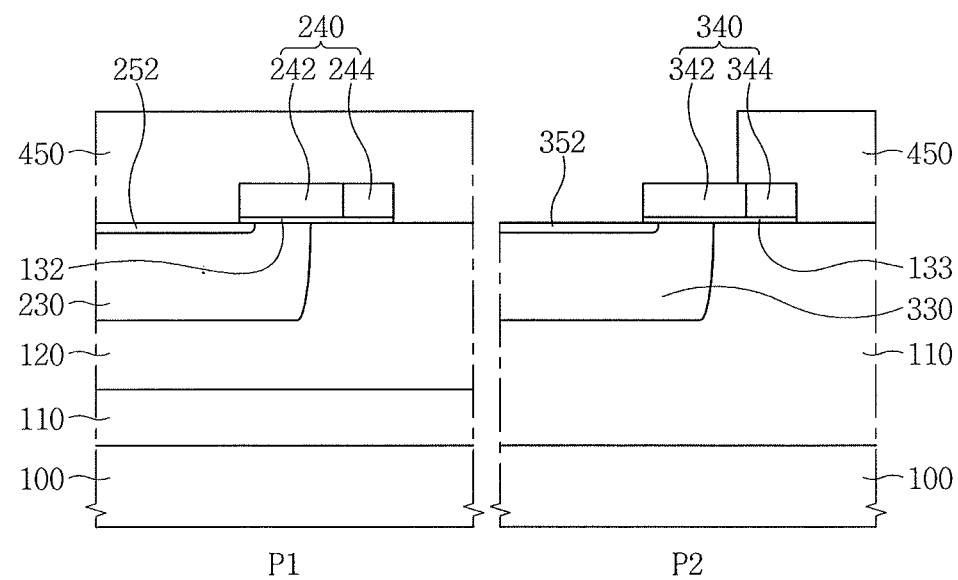
Figure 7Q:
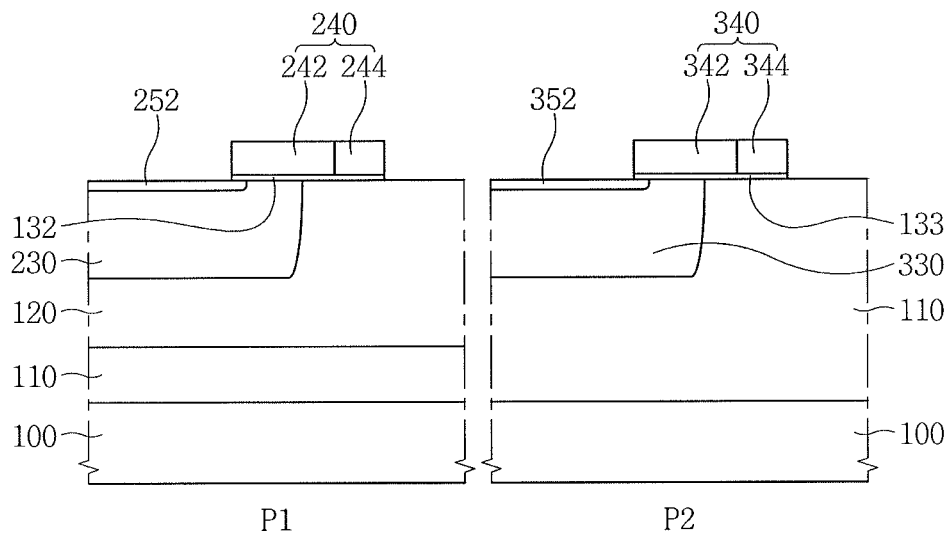
Figure 7R:
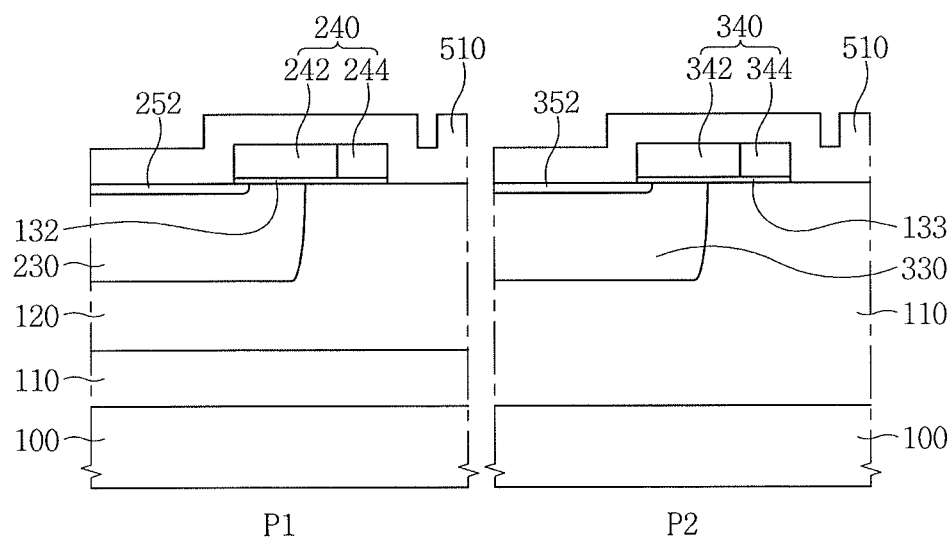
Figure 7S:
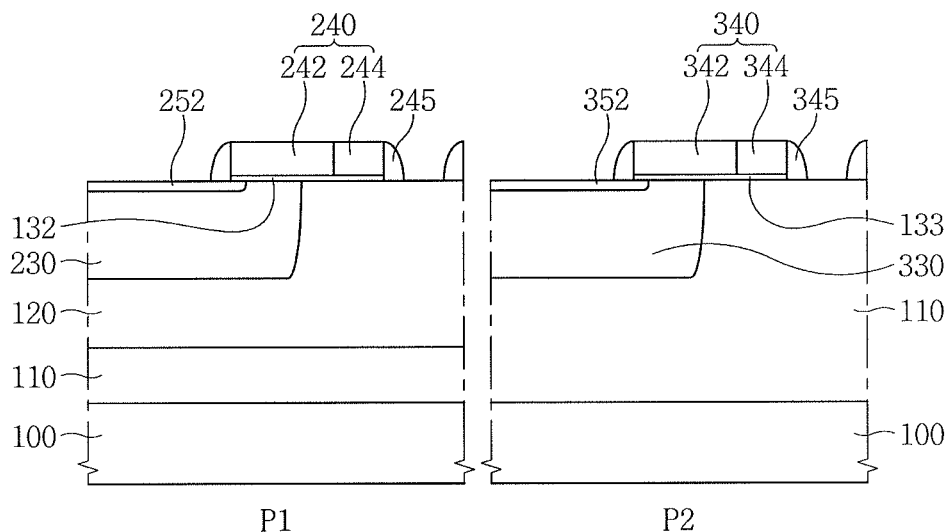
Figure 7T:
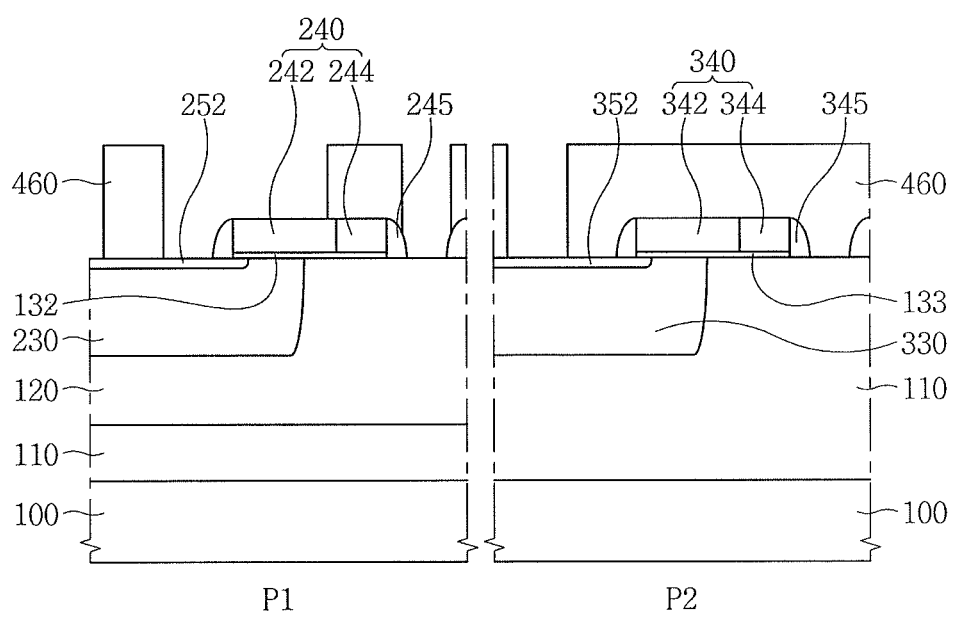
Figure 7U:
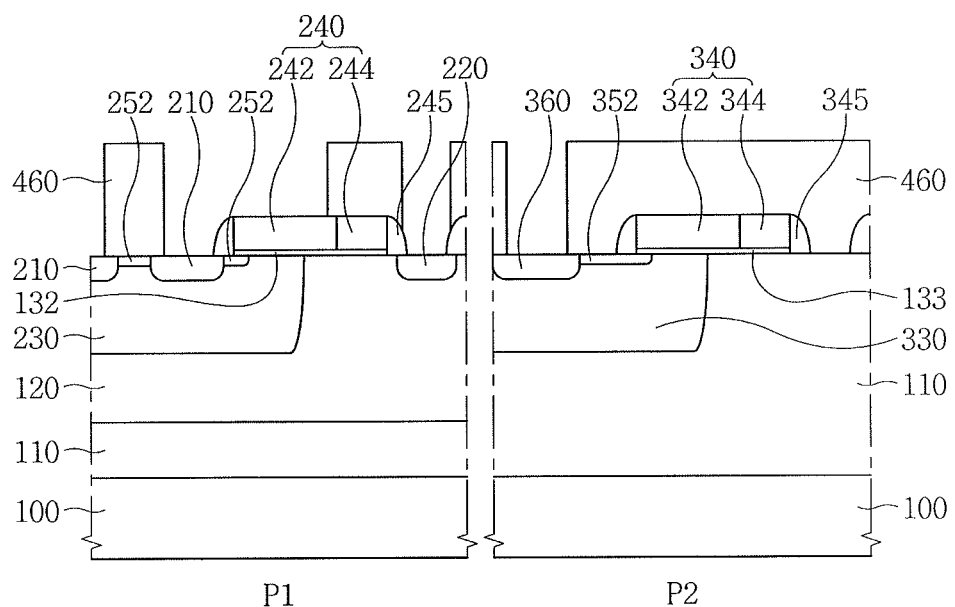
Figure 7V:
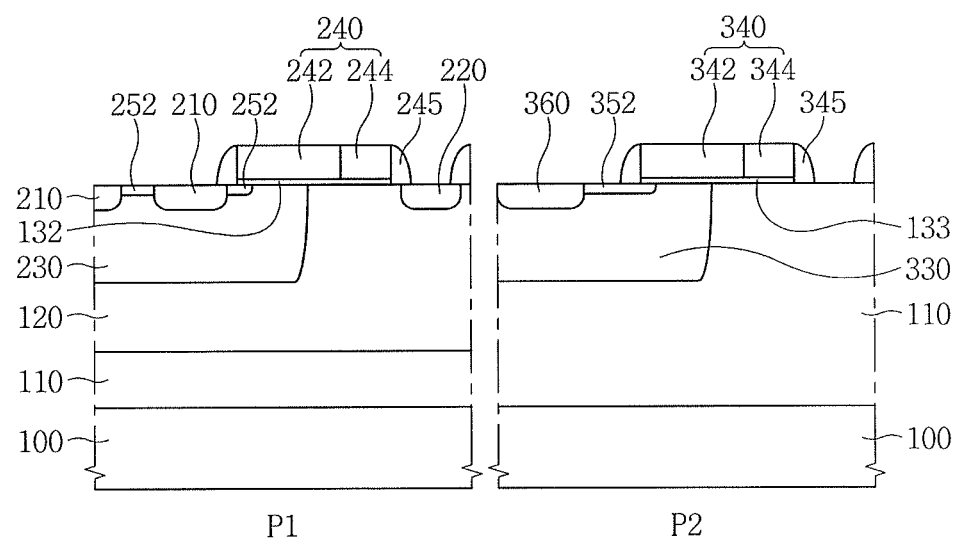
Figure 7W:
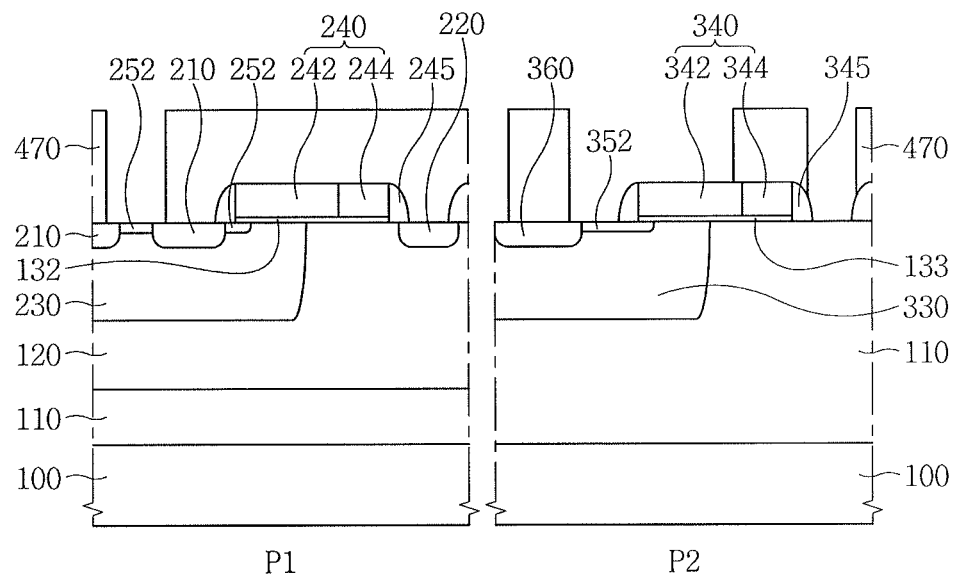
Figure 7X:
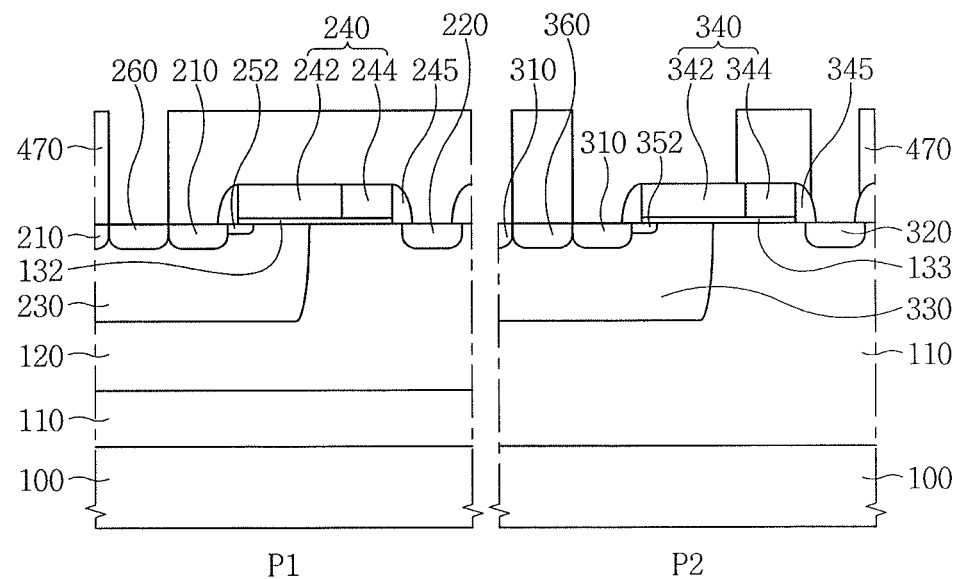

FIGS. 7A to 7X illustrate an embodiment of a method of fabricating a semiconductor device. The semiconductor device being fabricated in this method corresponds to the device shown in FIGS. 1A and 1B.

First, referring to FIG. 7A, the method includes a process of forming a first well 110 in a semiconductor substrate 100 including an NMOS area P1 and a PMOS area P2. The process of forming a first well 110 may include a process of preparing the semiconductor substrate 100 including the NMOS area P1 and the PMOS area P2, and a process of doping an upper portion of the semiconductor substrate 100 with N-type dopants. The process of preparing the semiconductor substrate 100 may include a process of doping the whole semiconductor substrate 100 with P-type dopants. The process of doping an upper portion of the semiconductor substrate 100 with N-type dopants may include a process of doping the whole top portion of the semiconductor substrate 100 with the N-type dopants, and a process of diffusing the N-type dopants.

Referring to FIG. 7B, the method may include a process of forming a first mask pattern 410 on the semiconductor substrate 100. The process of forming a first mask pattern 410 may include a process of covering the PMOS area P2 of the semiconductor substrate 100 with the first mask pattern 410. The NMOS area P1 of the semiconductor substrate 100 may not be covered with the first mask pattern 410.

Referring to FIG. 7C, the method may include a process of forming a second well 120 in the semiconductor substrate 100 using the first mask pattern 410. The process of forming a second well 120 may include a process of doping the NMOS area P1 of the semiconductor substrate 100 with the P-type dopants using the first mask pattern 410. The process of doping the NMOS area P1 of the semiconductor substrate 100 with the P-type dopants may include a process of implanting the P-type dopants into the whole top portion of the first well 110 of the NMOS area P1, and a process of diffusing the P-type dopants. The process of forming a second well 120 may include a process of forming the second well 120 in the first well 110 of the NMOS area P1.

Referring to FIG. 7D, the method may include a process of forming a second mask pattern 420 on the semiconductor substrate 100. The process of forming a second mask pattern 420 may include a process of removing the first mask pattern 410 and a process of covering the whole NMOS area P1 and a portion of the PMOS area P2 with the second mask pattern 420. A PMOS body region 330 may be formed in the PMOS area P2 exposed by the second mask pattern 420 through a subsequent process.

Referring to FIG. 7E, the method may include a process of forming the PMOS body region 330 using the second mask pattern 420. The process of forming the PMOS body region 330 may include a process of doping the PMOS area P2 exposed by the second mask pattern 420 with N-type dopants. The process of forming the PMOS body region 330 may include a process of forming the PMOS body region 330 in the first well 110 of the PMOS area P2.

Referring to FIG. 7F, the method may include a process of forming a third mask pattern 430 on the semiconductor substrate 100. The process of forming a third mask pattern 430 may include a process of removing the second mask pattern 420 and a process of covering the whole PMOS area P2 and a portion of the NMOS area P1 with the third mask pattern 430. An NMOS body region 230 may be formed in the NMOS area P1 exposed by the third mask pattern 430 in a subsequent process.

Referring to FIG. 7G, the method may include a process of forming the NMOS body region 230 using the third mask pattern 430. The process of forming the NMOS body region 230 may include a process of doping the NMOS area P1 exposed by the third mask pattern 430 with the P-type dopants. The process of foaming the NMOS body region 230 may include a process of forming the NMOS body region 230 in the second well 120 of the NMOS area P1.

In this embodiment of the method, the NMOS body region 230 may be formed after the PMOS body region 330 is formed. However, the NMOS body region 230 may be formed before the PMOS body region 330 is formed in other embodiments.

Referring to FIG. 7H, the method may include a process of removing the third mask pattern 430.

Referring to FIG. 7I, the method may include a process of forming an oxide layer 130 on the semiconductor substrate 100. The process of forming an oxide layer 130 may include a process of oxidizing a top of the semiconductor substrate. The process of forming an oxide layer 130 may include a process of oxidizing a top of the first well 110 and a top of the second well 120.

Referring to FIG. 7J, the method may include a process of forming a gate layer 160 on the oxide layer 130. The process of forming a gate layer 160 may include a process of forming the gate layer 160 with polysilicon.

Referring to FIG. 7K, the method may include a process of forming an NMOS oxide pattern 132, a PMOS oxide pattern 133, a first NMOS preliminary gate pattern 200, and a first PMOS preliminary gate pattern 300 on the semiconductor substrate 100.

The process of forming an NMOS oxide pattern 132, a PMOS oxide pattern 133, a first NMOS preliminary gate pattern 200, and a first PMOS preliminary gate pattern 300 may include a process of patterning the gate layer 160 and a process of patterning the oxide layer 130.

The process of patterning the gate layer 160 may include a process of forming the first NMOS preliminary gate pattern 200 on the NMOS area P1 of the semiconductor substrate 100 and a process of forming the first PMOS preliminary gate pattern 300 on the PMOS area P2 of the semiconductor substrate 100. The process of forming the first PMOS preliminary gate pattern 300 may be simultaneously performed with the process of forming the first NMOS preliminary gate pattern 200.

The process of forming the first NMOS preliminary gate pattern 200 may include a process of forming the first NMOS preliminary gate pattern 200 partially vertically overlapping the NMOS body region 230.

The process of forming the first PMOS preliminary gate pattern 300 may include a process of forming the first PMOS preliminary gate pattern 300 partially vertically overlapping the PMOS body region 330.

The process of patterning the oxide layer 130 may include a process of forming the NMOS oxide pattern 132 on the NMOS area P1 of the semiconductor substrate 100 and a process of forming the PMOS oxide pattern 133 on the PMOS area P2 of the semiconductor substrate 100. The process of forming the PMOS oxide pattern 133 may be simultaneously performed with the process of forming the NMOS oxide pattern 132.

The process of forming the NMOS oxide pattern 132 may include a process of removing the oxide layer 130 on the NMOS area P1, which is exposed by the first NMOS preliminary gate pattern 200.

The process of forming the PMOS oxide pattern 133 may include a process of removing the oxide layer 130 on the PMOS area P2, which is exposed by the first PMOS preliminary gate pattern 300.

Referring to FIG. 7L, the method may include a process of forming a fourth mask pattern 440 on the semiconductor substrate 100. The process of forming a fourth mask pattern 440 may include a process of covering the whole PMOS area P2 and a portion of the NMOS area P1 with the fourth mask pattern 440.

The process of forming a fourth mask pattern 440 may include a process of exposing a top of the NMOS body region 230 by the fourth mask pattern 440.

The process of forming a fourth mask pattern 440 may include a process of exposing a portion of the first NMOS preliminary gate pattern 200 by the fourth mask pattern 440. The first NMOS preliminary gate pattern 200 exposed the fourth mask pattern 440 may be disposed close to the NMOS body region 230. A first NMOS gate 242 may be formed in the first NMOS preliminary gate pattern 200 exposed by the fourth mask pattern 440 through a subsequent process. A second NMOS gate 244 may be formed in the first NMOS preliminary gate pattern 200 covered by the fourth mask pattern 440 through a subsequent process.

Referring to FIG. 7M, the method may include a process of forming an NMOS gate pattern 240 and a first NMOS LDD region 252 using the fourth mask pattern 440. The process of forming an NMOS gate pattern 240 and a first NMOS LDD region 252 may include a process of forming the NMOS gate pattern 240 on the semiconductor substrate 100 and a process of forming the first NMOS LDD region 252 in the semiconductor substrate 100. The process of forming the first NMOS LDD region 252 may be simultaneously performed with the process of forming the NMOS gate pattern 240.

The process of forming the NMOS gate pattern 240 on the semiconductor substrate 100 may include forming the first NMOS gate 242 and the second NMOS gate 244 in the first NMOS preliminary gate pattern 200. The first NMOS gate 242 may include the N-type dopants. The second NMOS gate 244 may be an intrinsic region. The process of forming the first NMOS gate 242 and the second NMOS gate 244 may include a process of doping the first NMOS preliminary gate pattern 200 exposed by the fourth mask pattern 440 with the N-type dopants having a first concentration. For example, the first concentration may be a range of $1 \times 10^{18}$ to $1 \times 10^{19}$ atoms/cm$^2$.

The process of forming the first NMOS LDD region 252 in the semiconductor substrate 100 may include a process of doping the semiconductor substrate 100 exposed by the fourth mask pattern 440 and the first NMOS preliminary gate pattern 200 with the N-type dopants having the first concentration. The process of forming the first NMOS LDD region 252 may include a process of forming the first NMOS LDD region 252 in the NMOS body region 230.

Referring to FIG. 7N, the method may include a process of removing the fourth mask pattern 440.

Referring to FIG. 7O, the method may include a process of forming a fifth mask pattern 450 on the semiconductor substrate 100. The process of forming a fifth mask pattern 450 may include a process of covering the whole NMOS area P1 and a portion of the PMOS area P2 with the fifth mask pattern 450.

The process of forming a fifth mask pattern 450 may include a process of exposing a top of the PMOS body region 330 by the fifth mask pattern 450.

The process of forming a fifth mask pattern 450 may include a process of exposing a portion of the first PMOS preliminary gate pattern 300 by the fifth mask pattern 450. The first PMOS preliminary gate pattern 300 exposed by the fifth mask pattern 450 may be disposed close to the PMOS body region 330. A first PMOS gate 342 may be formed in the first PMOS preliminary gate pattern 300 exposed by the fifth mask pattern 450 through a subsequent process. A second PMOS gate 344 may be formed in the first PMOS preliminary gate pattern 300 covered with the fifth mask pattern 450 through a subsequent process.

Referring to FIG. 7P, the method may include a process of forming a PMOS gate pattern 340 and a first PMOS LDD region 352 using the fifth mask pattern 450. The process of foaming a PMOS gate pattern 340 and a first PMOS LDD region 352 may include a process of forming the PMOS gate pattern 340 on the semiconductor substrate 100 and a process of forming the first PMOS LDD region 352 in the semiconductor substrate 100. The process of forming the first PMOS LDD region 352 may be simultaneously performed with the process of forming the PMOS gate pattern 340.

The process of forming the PMOS gate pattern 340 on the semiconductor substrate 100 may include a process of forming the first PMOS gate 342 and the second PMOS gate 344 in the first PMOS preliminary gate pattern 300. The first PMOS gate 342 may include the P-type dopants. The second PMOS gate 344 may include an intrinsic region. The process of forming the first PMOS gate 342 and the second PMOS gate 344 may include a process of doping the first PMOS preliminary gate pattern 300 exposed by the fifth mask pattern 450 with the P-type dopants having the first concentration.

The process of forming the first PMOS LDD region 352 in the semiconductor substrate 100 may include a process of doping the semiconductor substrate 100 exposed by the fifth mask pattern 450 and the first PMOS preliminary gate pattern 300 with the P-type dopants having the first concentration. The process of forming the first PMOS LDD region 352 may include a process of forming the first PMOS LDD region 352 in the PMOS body region 330.

Referring to FIG. 7Q, the method may include a process of removing the fifth mask pattern 450.

Referring to FIG. 7R, the method may include a process of forming a spacer layer 510 on the semiconductor substrate 100. The process of forming a spacer layer 510 may include a process of forming the spacer layer 510 covering the NMOS gate pattern 240 and the PMOS gate pattern 340.

Referring to FIG. 7S, the method may include a process of forming an NMOS spacer 245 and a PMOS spacer 345 on the semiconductor substrate 100. The process of forming an NMOS spacer 245 and a PMOS spacer 345 may include a process of forming the NMOS spacer 245 disposed on a side of the NMOS gate pattern 240 and a process of forming the PMOS spacer 345 disposed on a side of the PMOS gate pattern 340. The process of forming the PMOS spacer 345 may be simultaneously performed with the process of forming the NMOS spacer 245.

The process of forming the NMOS spacer 245 may include a process of anisotropically dry etching spacer layer 510 on the first NMOS area P1. The process of forming the PMOS spacer 345 may include a process of anisotropically dry etching the spacer layer 510 on the PMOS area P2.

Referring to FIG. 7T, the method may include a process of forming a sixth mask pattern 460 on the semiconductor substrate 100. The process of forming a sixth mask pattern 460 may include a process of partially exposing the NMOS area P1 and the PMOS area P2 by the sixth mask pattern 460.

The process of forming a sixth mask pattern 460 may include a process of covering the second NMOS gate 244 of the NMOS gate pattern 240 with the sixth mask pattern 460.

The process of forming a sixth mask pattern may include a process of covering a portion of the NMOS body region 230 with the sixth mask pattern 460.

The process of forming a sixth mask pattern 460 may include covering the PMOS gate pattern 340 with the sixth mask pattern 460.

The process of forming a sixth mask pattern 460 may include a process of exposing a portion of the PMOS body region 330 by the sixth mask pattern 460.

An NMOS source region 210 and an NMOS drain region 220 may be formed in the NMOS area P1 exposed by the sixth mask pattern 460 through a subsequent process. A PMOS body contact region 360 may be formed in the PMOS area P2 exposed by the sixth mask pattern 460 through a subsequent process.

A relative position of the NMOS body region 230 covered with the sixth mask pattern 460 may be same as that of the PMOS body region 330 exposed by the sixth mask pattern 460. The relative position may mean a horizontal distance from one element to another element adjacent thereto in a corresponding region. For example, the shortest horizontal distance between the NMOS body region 230 covered with sixth mask pattern 460 and the NMOS gate pattern 240 may be the same as the shortest horizontal distance between the PMOS body region 330 exposed by the sixth mask pattern 460 and the PMOS gate pattern 340.

Referring to FIG. 7U, the method may include a process of forming the NMOS source region 210, the NMOS drain region 220, and the PMOS body contact region 360 using the sixth mask pattern 460. The process of forming the NMOS source region 210, the NMOS drain region 220, and the PMOS body contact region 360 may include a process of doping the NMOS area P1 and the PMOS area P2 exposed by the sixth mask pattern 460 with the N-type dopants having a second concentration. The second concentration may be higher than the first concentration. For example, the second concentration may be a range of $3 \times 10^{19}$ to $5 \times 10^{20}$ atoms/cm$^2$.

Referring to FIG. 7V, the method may include a process of removing the sixth mask pattern 460.

Referring to FIG. 7W, the method may include a process of forming a seventh mask pattern 470 on the semiconductor substrate 100. The process of forming a seventh mask pattern 470 may include a process of partially exposing the NMOS area P1 and the PMOS area P2 by the seventh mask pattern 470.

The process of forming a seventh mask pattern 470 may include a process of covering the NMOS gate pattern 240 with the seventh mask pattern 470.

The process of forming a seventh mask pattern 470 may include a process of exposing a portion of the NMOS body region 230 by the seventh mask pattern 470. The NMOS body region 230 exposed by the seventh mask pattern 470 may be the NMOS body region 230 covered with the sixth mask pattern 460. The process of forming a seventh mask pattern 470 may include a process of covering the second PMOS gate 344 of the PMOS gate pattern 340 with the seventh mask pattern 470. The process of forming a seventh mask pattern 470 may include a process of covering a portion of the PMOS body region 330 with the seventh mask pattern 470. The PMOS body region 330 covered with the seventh mask pattern 470 may be the PMOS body region 330 exposed by the sixth mask pattern 460.

Referring to FIG. 7X, the method may include a process of forming an NMOS body contact region 260, a PMOS source region 310, and a PMOS drain region 320 using the seventh mask pattern 470.

The process of forming the NMOS body contact region 260, the PMOS source region 310, and the PMOS drain region 320 may include a process of doping the NMOS area P1 and the PMOS area P2 exposed by the seventh mask pattern 470 with the P-type dopants having the second concentration.

Referring to FIGS. 1A and 1B, the method of fabricating a semiconductor device according to one embodiment may include a process of removing the seventh mask pattern 470.

FIGS. 8A to 8H illustrate another embodiment of fabricating a semiconductor device. This method will be described with reference to FIGS. 2 and 8A to 8H.

Figure 8A:
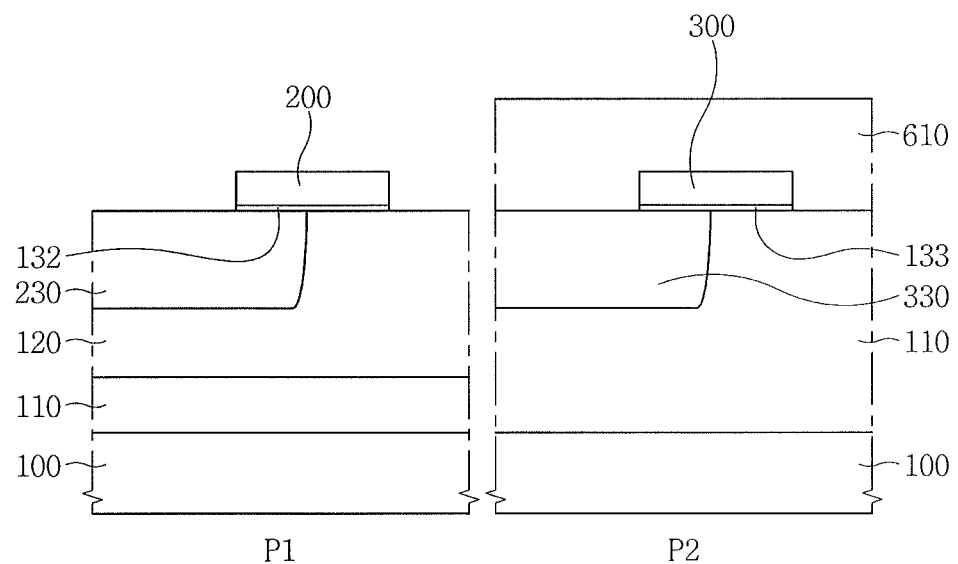
FIGS. 8A to 8H illustrate another embodiment of a method of fabricating a semiconductor device.

First, referring to FIG. 8A, the method may include a process of preparing a semiconductor substrate 100 including an NMOS area P1 and a PMOS area P2, a process of forming a first well 110 in the semiconductor substrate 100, a process of forming a second well 120 in the first well 110 of the NMOS area P1, a process of forming a PMOS body region 330 in the first well 110 of the PMOS area P2, a process of forming the NMOS body region 230 in the second well 120 of the NMOS area P1, and a process of forming a first NMOS preliminary gate pattern 200 on the NMOS area P1.

The method may further include a process of forming a first PMOS preliminary gate pattern 300 on the PMOS area P2, a process of forming an NMOS oxide pattern 132 below the first NMOS preliminary gate pattern 200, a process of forming a PMOS oxide pattern 133 below the first PMOS preliminary gate pattern 300, and a process of forming an eighth mask pattern 610 on the semiconductor substrate 100.

The process of forming an eighth mask pattern 610 may include a process of covering the whole PMOS area P2 of the semiconductor substrate 100 with the eighth mask pattern 610.

Figure 8B:
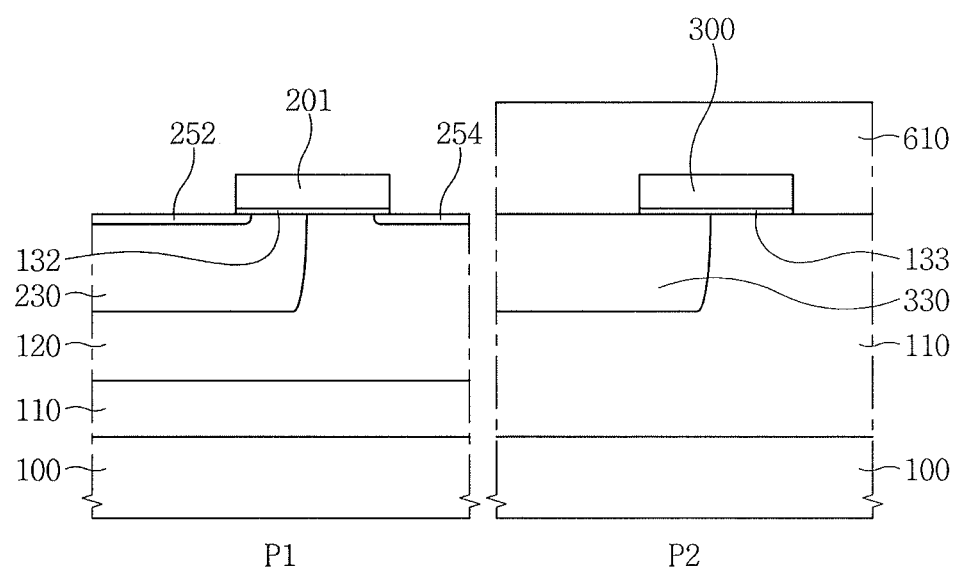

Referring to FIG. 8B, the method may include a process of forming a second NMOS preliminary gate pattern 201, a first NMOS LDD region 252, and a second NMOS LDD region 254 using the eighth mask pattern 610.

The process of forming a second NMOS preliminary gate pattern 201, a first NMOS LDD region 252, and a second NMOS LDD region 254 may include a process of forming the first NMOS preliminary gate pattern 200 into the second NMOS preliminary gate pattern 201, a process of forming the first NMOS LDD region 252 in the NMOS body region 230, and a process of forming the second NMOS LDD region 254 in the second well 120.

The process of forming the second NMOS LDD region 254 may be simultaneously performed with the process of forming the first NMOS LDD region 252. The process of forming the first NMOS LDD region 252 may be simultaneously performed with the process of forming the second NMOS preliminary gate pattern 201.

The process of forming the second NMOS preliminary gate pattern 201, the first NMOS LDD region 252, and the second NMOS LDD region 254 may include a process of doping N-type dopants having the first concentration into the NMOS area P1 exposed by the eighth mask pattern 610. The first concentration may be a range of $1 \times 10^{18}$ to $1 \times 10^{19}$ atoms/cm$^2$.

Figure 8C:
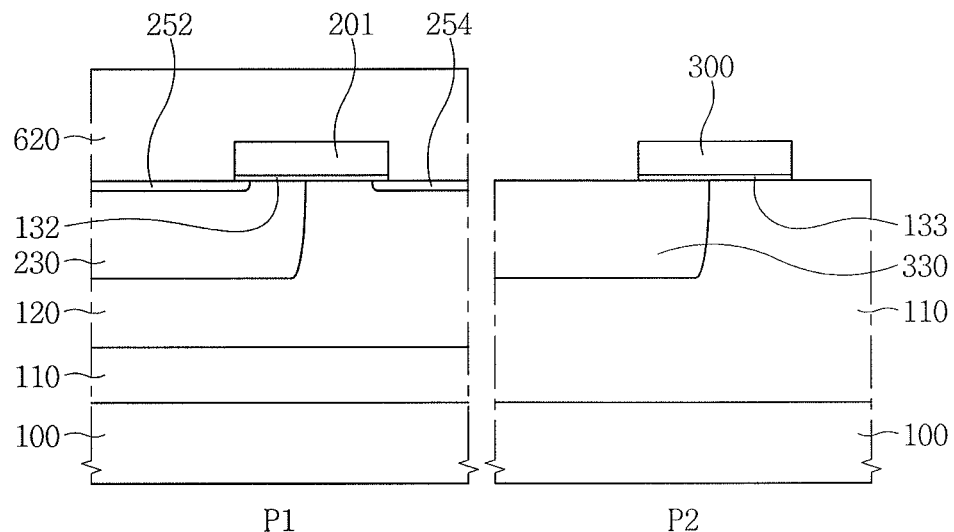

Referring to FIG. 8C, the method may include a process of removing the eighth mask pattern 610 and a process of forming a ninth mask pattern 620 on the semiconductor substrate 100. The process of forming a ninth mask pattern 620 may be performed after the process of removing the eighth mask pattern 610 is performed.

Figure 8D:
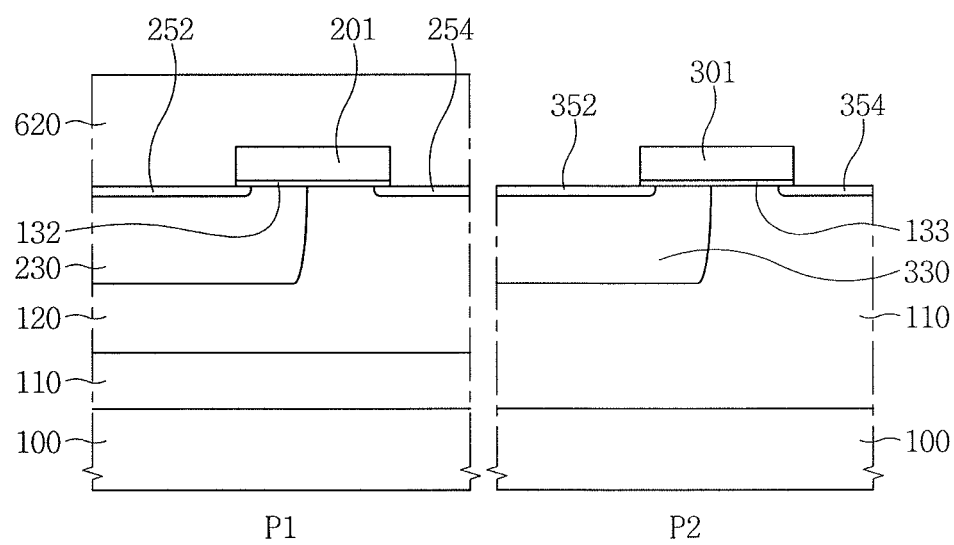

Referring to FIG. 8D, the method may include a process of forming a second PMOS preliminary gate pattern 301, a first PMOS LDD region 352, and a second PMOS LDD region 354 using the ninth mask pattern.

The process of forming a second PMOS preliminary gate pattern 301, a first PMOS LDD region 352, and a second PMOS LDD region 354 may include a process of forming the first PMOS preliminary gate pattern 300 into the second PMOS preliminary gate pattern 301, a process of forming the first PMOS LDD region 352 in the PMOS body region 330, and a process of forming the second PMOS LDD region 354 in the first well 110 of the PMOS area P2.

The process of forming the second PMOS LDD region 354 may be simultaneously performed with the process of forming the first PMOS LDD region 352. The process of forming the first PMOS LDD region 352 may be simultaneously performed with the process of forming the second PMOS preliminary gate pattern 301.

The process of forming a second PMOS preliminary gate pattern 301, a first PMOS LDD region 352, and a second PMOS LDD region 354 may include a process of doping P-type dopants having the first concentration into the PMOS area P2 exposed by the ninth mask pattern 620.

Figure 8E:
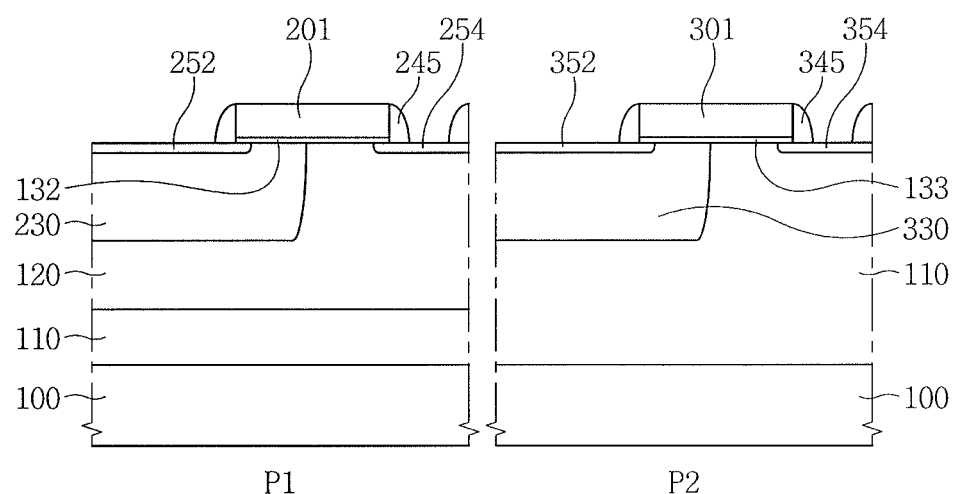

Referring to FIG. 8E, the method may include a process of removing the ninth mask pattern 620, a process of forming an NMOS spacer 245, and a process of forming a PMOS spacer 345.

Figure 8F:
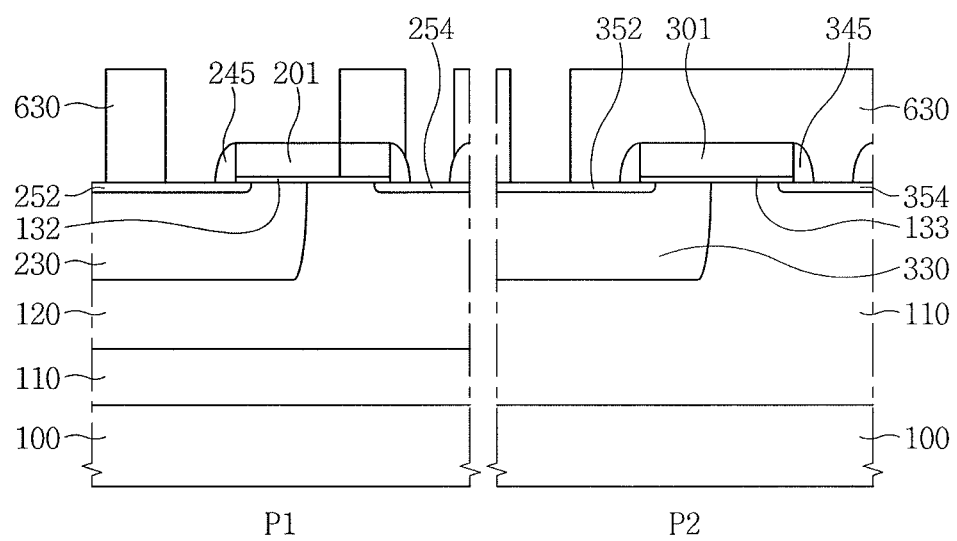

Referring to FIG. 8F, the method may include a process of forming a tenth mask pattern 630 on the semiconductor substrate 100. The process of forming a tenth mask pattern 630 may include a process of partially exposing the NMOS area P1 and the PMOS area P2 by the tenth mask pattern 630.

The process of forming a tenth mask pattern 630 may include a process of exposing a portion of the second NMOS preliminary gate pattern 201 by the tenth mask pattern 630. The second NMOS preliminary gate pattern 201 exposed by the tenth mask pattern 630 may be disposed close to the NMOS body region 230.

The process of forming a tenth mask pattern 630 may include a process of covering a portion of the NMOS body region 230 with the tenth mask pattern 630.

The process of forming a tenth mask pattern 630 may include a process of covering the second PMOS preliminary gate pattern 301 with the tenth mask pattern 630.

The process of forming a tenth mask pattern may include a process of exposing a portion of the PMOS body region 330 by the tenth mask pattern 630.

Figure 8G:
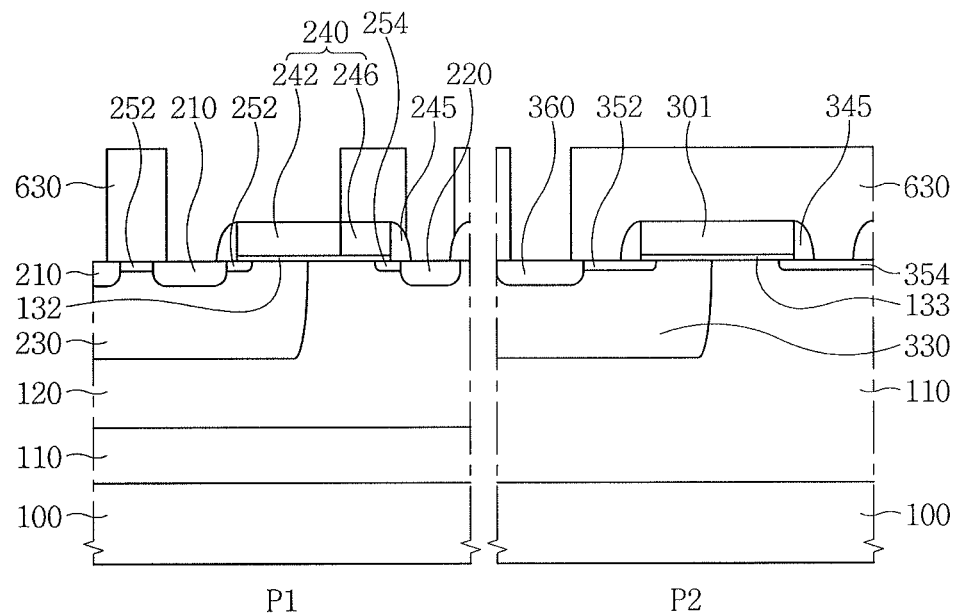

Referring to FIG. 8G, the method may include a process of forming an NMOS source region 210, an NMOS drain region 220, an NMOS gate pattern 240, and a PMOS body contact region 360 using the tenth mask pattern 630.

The process of forming an NMOS source region 210, an NMOS drain region 220, an NMOS gate pattern 240, and a PMOS body contact region 360 may include a process of doping the NMOS area P1 and the PMOS area P2 exposed by the tenth mask pattern 630 with the N-type dopants having a second concentration. The second concentration may be higher than the first concentration. For example, the second concentration may be a range of $3 \times 10^{19}$ to $5 \times 10^{20}$ atoms/cm$^2$.

The process of forming an NMOS source region 210, an NMOS drain region 220, an NMOS gate pattern 240, and a PMOS body contact region 360 may include a process of forming the NMOS gate pattern 240 including a first NMOS gate 242 and a second NMOS gate 246. An average concentration of the N-type dopants in the second NMOS gate 246 may be the same, or in the same range, as the first concentration. An average concentration of the N-type dopants in the first NMOS gate 242 may be the same, or in the same range, as the second concentration.

Figure 8H:
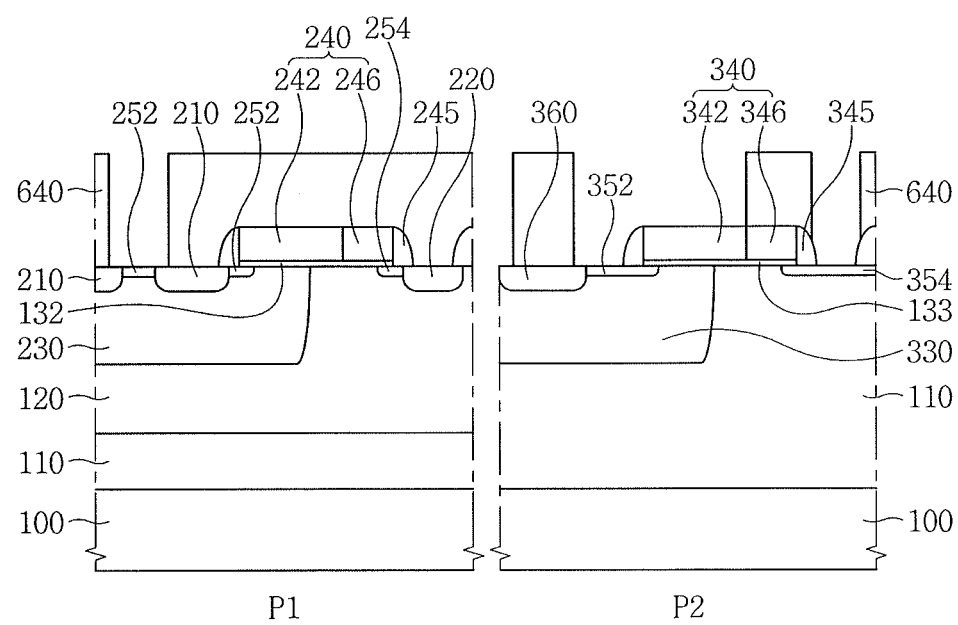

Referring to FIG. 8H, the method may include a process of removing the tenth mask pattern 630, a process of forming an eleventh mask pattern 640 on the semiconductor substrate 100, and a process of forming an NMOS body contact region 260, a PMOS source region 310, a PMOS drain region 320, and a PMOS gate pattern 340 using the eleventh mask pattern 640.

The process of forming an eleventh mask pattern 640 may be performed after the process of removing the tenth mask pattern 630 is performed. The process of forming an eleventh mask pattern 640 may include a process of partially exposing the NMOS area P1 and the PMOS area P2 by the eleventh mask pattern 640.

The process of forming an eleventh mask pattern 640 may include a process of covering the NMOS area P1 and the PMOS area P2 exposed by the tenth mask pattern 630 in FIG. 8F with the eleventh mask pattern 640.

The process of framing an NMOS body contact region 260, a PMOS source region 310, a PMOS drain region 320, and a PMOS gate pattern 340 may include a process of doping the NMOS area P1 and the PMOS area P2 exposed by the eleventh mask pattern 640 with the P-type dopants having the second concentration.

The process of forming an NMOS body contact region 260, a PMOS source region 310, a PMOS drain region 320, and a PMOS gate pattern 340 may include a process of forming the PMOS gate pattern 340 including a first PMOS gate 342 and a second PMOS gate 346. An average concentration of the P-type dopants in the second PMOS gate 346 may be the same, or in the same range, as the first concentration. An average concentration of the P-type dopants in the first PMOS gate 342 may be the same as the second concentration.

Referring to FIG. 2, the method may include a process of removing the eleventh mask pattern 640.

Figure 9:
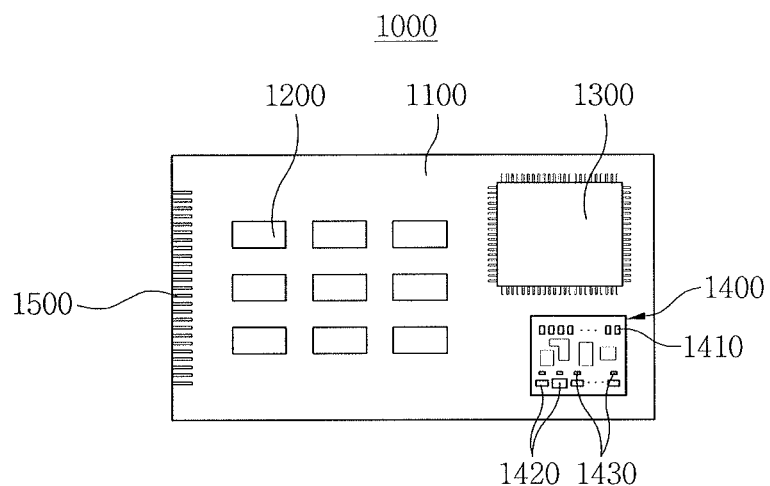
FIG. 9 illustrates an embodiment of a semiconductor module including a semiconductor device.

FIG. 9 illustrates an embodiment of a semiconductor module including a semiconductor device according to any of the aforementioned embodiments. Referring to FIG. 9, a semiconductor module 1000 may include a module substrate 1110, memories 1200, a microprocessor 1300, a power management integrated circuit (PMIC) 1400, and input/output (I/O) terminals 1500. The memories 1200, the microprocessor 1300, and the PMIC 1400 may be mounted on the module substrate 1100. The semiconductor module 1000 may include a memory card or a card package.

The PMIC 1400 may include at least one low dropout (LDO) regulator 1410, at least one buck converter 1420, and at least one controller 1430. The buck converter 1420 may include a linear regulator or a switching regulator. The LDO regulator 1410 and the buck converter 1420 may include the semiconductor devices according to any of the aforementioned embodiments. Therefore, in the semiconductor module 1000 operation characteristics of the LDO regulator 1410 and the buck converter 1420 may be improved. Also, in this embodiment of the semiconductor module 1000, voltages applied to the memories 1200 and the microprocessor 1300 may be efficiently managed.

Figure 10:
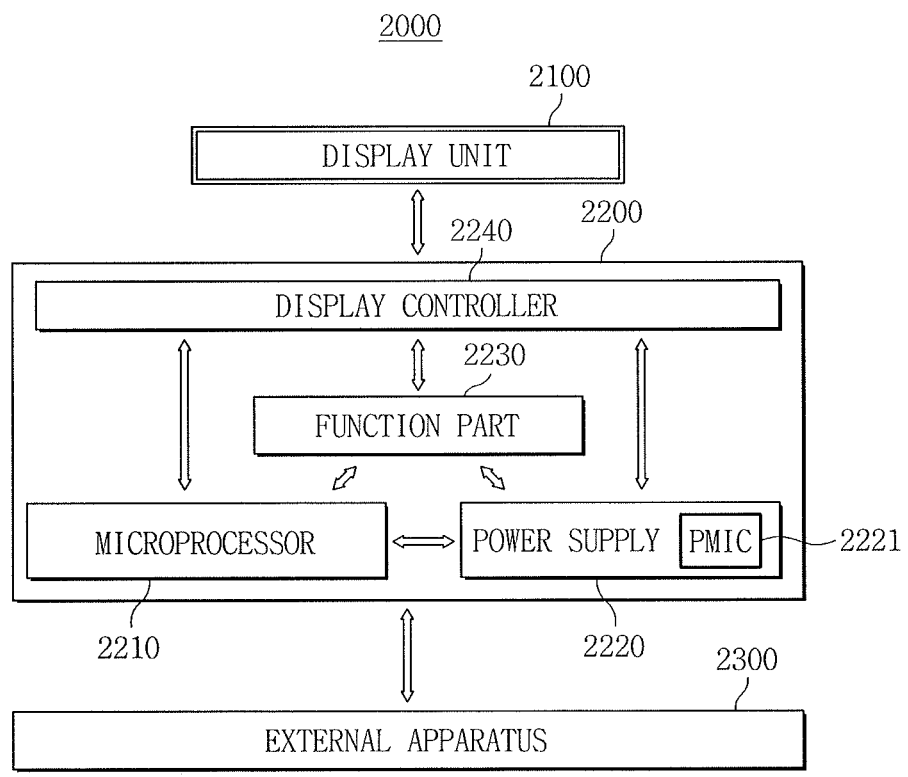
FIG. 10 illustrates an embodiment of a mobile system which including a semiconductor device.

FIG. 10 illustrates an embodiment of a mobile system which includes a semiconductor device according to any of the aforementioned embodiments. Referring to FIG. 10, a mobile system 2000 may include a display unit 2100, a body unit 2200, and an external apparatus 2300. The body unit 2200 may include a microprocessor 2210, a power supply 2220, a function part 2230, and a display controller 2240.

The display unit 2100 may be electrically connected to the body unit 2200. The display unit 2100 may implant an image processed by the display controller 2240 of the body unit 2200. The body unit 2200 may be a system board or a mother board including a printed circuit board (PCB). The microprocessor 2210, the power supply 2220, the function part 2230, and the display controller 2240 may be installed or mounted on the body unit 2200.

The microprocessor 2210 may receive a voltage from the power supply 2220 and control the function part 2230 and the display controller 2240. The power supply 2220 may receive a constant voltage from an external power supply, divide the voltage into voltages having required voltage levels, and supply the divided voltages to the microprocessor 2210, the function part 2230, the display controller 2240 and the like.

The power supply 2220 may include a PMIC 2221 The PMIC 2221 may include semiconductor devices according to any of the aforementioned embodiments. Therefore, in this embodiment of the mobile system 2000, efficiency of the PMIC 2221 may be improved. Therefore, in this mobile system 2000, voltages may be efficiently applied to the microprocessor 2210, the function part 2230, and the display controller 2240.

The function part 2230 may perform various functions of the mobile system 2000. For example, the function part 2230 may include several components capable of performing wireless communication functions, such as the output of an image to the display unit 2100 or the output of a voice to a speaker, by dialing or communication with the external apparatus 2300. For example, the functional part 2230 may serve as an image processor of a camera. When the mobile system 2000 is connected to a memory card and the like to increase the capacity thereof, the function part 2230 may serve as a memory card controller. Furthermore, when the mobile system 2000 further includes a universal serial bus (USB) and the like to expand functions thereof, the function part 2230 may serve as an interface controller.

Figure 11:
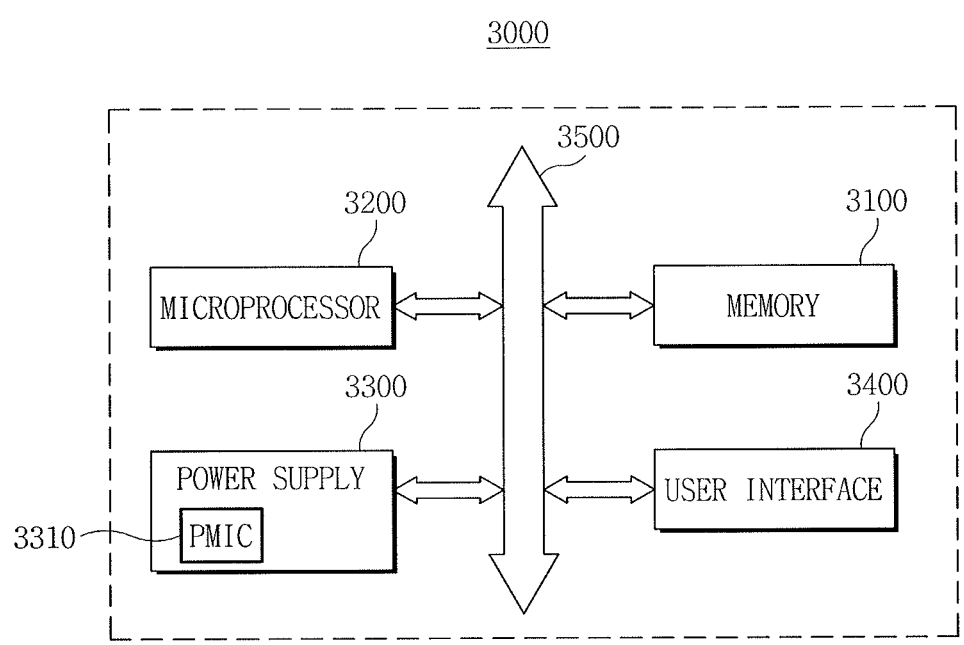
FIG. 11 illustrates an embodiment of an electronic system including a semiconductor device.

FIG. 11 illustrates an embodiment of an electronic system 3000 which includes a semiconductor device according to any of the aforementioned embodiments. Referring to FIG. 11, the electronic system 3000 may include a memory 3100, a microprocessor 3200, a power supply 3300, and a user interface 3400.

The memory 3100 may store codes for booting the microprocessor 3200, data processed by the microprocessor 3200, or an external input data. The memory 3100 may include a controller. The microprocessor 3200 may program and control the electronic system 3000. The microprocessor 3200 may include a random access memory (RAM) used as an operation memory thereof. The power supply 3300 may receive a constant voltage from an external power supply and the like and supply proper voltages to the memory 3100, the microprocessor 3200, and the user interface 3400 using the received constant voltage. The user interface 3400 may perform data communication using a bus 3500. The user interface 3400 may be used to input data to the electronic system 3000 or to output data from the electronic system 3000.

The power supply 3300 may include a PMIC 3310. The PMIC 3310 may include semiconductor devices having various configurations according to application fields. In this embodiment, the PMIC 3310 may efficiently provide power to allow the electronic system 3000 to stably operate. The electronic system 3000 may be a system such as a light emitting diode (LED) lighting apparatus, a refrigerator, an air conditioner, an industrial cutter, a welder, an automobile, a ship, an aircraft, or a satellite.

In accordance with one or more of the foregoing embodiments, a semiconductor device and a method of fabricating the same may increase a breakdown voltage between a source and drain and reduce turn-on resistance between the source and the drain. Also, operation characteristics may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
    a semiconductor substrate;
    a drain region in the semiconductor substrate;
    a well in the semiconductor substrate,
    a body region in the semiconductor substrate, spaced from the drain region, and adjacent the well;
    a source region in the body region; and
    a gate pattern on the semiconductor substrate and including dopants of a first conductivity type, wherein the gate pattern includes a first gate adjacent the source region and a second gate adjacent the drain region, the first gate to control formation of a first channel and the second gate to control formation of a second channel, the first channel to be connected to the second channel between the source and drain regions, wherein a concentration of the dopants of the first conductivity type in the first gate is higher than a concentration of the dopants of the first conductivity type in the second gate, and wherein a threshold voltage of the first channel is greater than a threshold voltage of the second channel based on a difference in concentration of dopants of a same conductivity type in the well and body region.

2. The semiconductor device as claimed in claim 1, wherein:
the drain region includes the first conductivity type dopants, and
a concentration of the first conductivity type dopants in the drain region is higher than a concentration of the first conductivity type dopants in the second gate.

3. The semiconductor device as claimed in claim 2, wherein the concentration of the first conductivity type dopants in the drain region is substantially equal to the concentration of the first conductivity type dopants in the first gate.

4. The semiconductor device as claimed in claim 2, wherein:
the source region includes the first conductivity type dopants, and
a concentration of the first conductivity type dopants in the source region is substantially equal to the concentration of the first conductivity type dopants in the first gate.

5. The semiconductor device as claimed in claim 1, further comprising:
a first lightly doped drain (LDD) region adjacent the source region and partially overlapping the first gate, wherein:
the first LDD region includes the first conductivity type dopants, and
a concentration of the first conductivity type dopants in the first LDD region is lower than the concentration of the first conductivity type dopants in the first gate.

6. The semiconductor device as claimed in claim 5, wherein the concentration of the first conductivity type dopants in the first LDD region is substantially equal to the concentration of the first conductivity type dopants in the second gate.

7. The semiconductor device as claimed in claim 6, further comprising:
a second LDD region disposed adjacent the drain region and partially overlapping the second gate, wherein the second LDD region is spaced from the body region.

8. The semiconductor device as claimed in claim 7, wherein:
the second LDD region includes the first conductivity type dopants, and
a concentration of the first conductivity type dopants in the second LDD region is substantially equal to the concentration of the first conductivity type dopants in the first LDD region.

9. The semiconductor device as claimed in claim 1, wherein the body region and the drain region are disposed in the well.

10. A semiconductor device, comprising:
a well;
a drain;
a source;
a gate pattern between the source and drain; and
a body adjacent the well and spaced from the drain, wherein:
the gate pattern includes a first gate to form a first channel, and a second gate to form a second channel, the first channel to be connected to the second channel between the source and drain,
the first gate is disposed adjacent the source,
the second gate is disposed between the first gate and the drain,
a first threshold voltage of the first channel is higher than a second threshold voltage of the second channel based on a difference in concentration of dopants of a same conductivity type in the well and body.

11. The semiconductor device as claimed in claim 10, wherein:
the first gate has a first concentration of a dopant,
the second gate has a second concentration of the dopant different from the first concentration, and
the difference between the first concentration of the dopant and the second concentration of the dopant is based on the difference between the first threshold voltage of the first channel and the second threshold voltage of the second channel.

12. The semiconductor device as claimed in claim 10, wherein the first channel and the second channel have different lengths.

13. The semiconductor device as claimed in claim 10, wherein the first gate contacts the second gate within substantially a same layer.

14. The semiconductor device as claimed in claim 10, wherein the first channel overlaps the well and the second channel does not overlap the well.

* * * * *